US011060206B2

(12) United States Patent
Kanatzidis et al.

(10) Patent No.: US 11,060,206 B2
(45) Date of Patent: Jul. 13, 2021

(54) METHOD FOR PURIFYING AN INORGANIC MATERIAL USING A TUBE HAVING A BEND BETWEEN A FIRST END AND A SECOND END OF THE TUBE

(71) Applicant: Northwestern University, Evanston, IL (US)

(72) Inventors: Mercouri G. Kanatzidis, Wilmette, IL (US); Wenwen Lin, Evanston, IL (US)

(73) Assignee: Northwestern University, Evanston, IL (US)

( * ) Notice: Subject to any disclaimer, the term of this patent is extended or adjusted under 35 U.S.C. 154(b) by 140 days.

(21) Appl. No.: 16/326,825

(22) PCT Filed: Aug. 25, 2017

(86) PCT No.: PCT/US2017/048653
§ 371 (c)(1),
(2) Date: Feb. 20, 2019

(87) PCT Pub. No.: WO2018/039583
PCT Pub. Date: Mar. 1, 2018

(65) Prior Publication Data
US 2019/0177878 A1 Jun. 13, 2019

Related U.S. Application Data

(60) Provisional application No. 62/379,860, filed on Aug. 26, 2016.

(51) Int. Cl.
*C30B 23/06* (2006.01)
*C30B 35/00* (2006.01)
(Continued)

(52) U.S. Cl.
CPC .......... *C30B 35/007* (2013.01); *C01B 19/007* (2013.01); *C01G 15/00* (2013.01);
(Continued)

(58) Field of Classification Search
CPC .... C30B 1/00; C30B 1/02; C30B 1/06; C30B 23/00; C30B 23/02; C30B 23/06;
(Continued)

(56) References Cited

U.S. PATENT DOCUMENTS 454,778 A 6/1891 Swartz
2,676,096 A 4/1954 Emert et al.
(Continued)

FOREIGN PATENT DOCUMENTS

WO WO 2017030624 2/2017
WO WO 2018017909 1/2018

OTHER PUBLICATIONS

S.L. Nguyen, et al. "Photoconductivity in TI6SI4: A novel semiconductor for hard radiation detection," Chem. Mater., vol. 25, pp. 2868-2877 (2013). (Year: 2013).*
(Continued)

*Primary Examiner* — Kenneth A Bratland, Jr.
(74) *Attorney, Agent, or Firm* — Bell & Manning, LLC

(57) ABSTRACT

Methods for purifying reaction precursors used in the synthesis of inorganic compounds and methods for synthesizing inorganic compounds from the purified precursors are provided. Also provided are methods for purifying the inorganic compounds and methods for crystallizing the inorganic compounds from a melt. γ and X-ray detectors incorporating the crystals of the inorganic compounds are also provided.

17 Claims, 25 Drawing Sheets

(51) Int. Cl.
*G01T 1/24* (2006.01)
*C01G 15/00* (2006.01)
*C01B 19/00* (2006.01)
*C30B 13/06* (2006.01)
*C30B 13/34* (2006.01)
C30B 13/14 (2006.01)
C30B 13/16 (2006.01)
C30B 13/30 (2006.01)

(52) U.S. Cl.
CPC .............. *C30B 13/06* (2013.01); *C30B 13/34* (2013.01); *C30B 23/06* (2013.01); *G01T 1/24* (2013.01); *C01P 2006/40* (2013.01); *C30B 13/14* (2013.01); *C30B 13/16* (2013.01); *C30B 13/30* (2013.01)

(58) Field of Classification Search
CPC ..... C30B 23/063; C30B 23/066; C30B 13/06; C30B 13/14; C30B 13/16; C30B 13/30; C30B 13/34; C01B 19/007; C01G 15/00; G01T 1/24; C01P 2006/40
USPC .......... 117/84, 106, 109, 200, 204, 937, 953
See application file for complete search history.

(56) References Cited

U.S. PATENT DOCUMENTS

| | | | |
|---|---|---|---|
| 2,871,100 A * | 1/1959 | Weiser | H01L 21/00 423/299 |
| 3,023,080 A | 2/1962 | Kulifay | |
| 4,775,425 A | 10/1988 | Guha et al. | |
| 5,513,834 A * | 5/1996 | Feldewerth | C01B 19/02 266/148 |
| 8,519,347 B2 | 8/2013 | Kanatzidis et al. | |

OTHER PUBLICATIONS

Nguyen, et al. publication entitled "Photoconductivity in Tl6SI4: A novel semiconductor for hard radiation detection," Chemistry of Materials, vol. 25, pp. 2868-2877 (2013). (Year: 2013).*

Proceedings vol. 9968, Hard X-Ray, Gamma-Ray, and Neutron Detector Physics XVIII; 99681A (2016), SPIE Optical Engineering +Applications, 2016, San Diego, California, United States.

Arachchige et al. "Mercouri G. Kanatzidis: Excellence and Innovations in Inorganic and Solid-State Chemistry," Inorganic Chemistry, vol. 56, 2017, pp. 7582-7597.

Johnsen et al., "Thallium Chalcohalides for X-ray and γ-ray Detection," Journal of the American Chemical Society, vol. 133, 2011, pp. 10030-10033.

McGuire et al., "Exploring Thallium Compounds as Thermoelectric Materials: Seventeen New Thallium Chalcogenides," Chem. Mater., vol. 17, No. 11, 2005, pp. 2875-2884.

Nguyen et al., "Photoconductivity in Tl6SI4: A Novel Semiconductor for Hard Radiation Detection," Chem. Mater., vol. 25, 2013, pp. 2868-2877.

Wibowo et al., "Thallium Mercury Chalcobromides, TlHg6Q4Br5 (Q=S, Se)," Inorganic Chemistry, 2013, pp. A-F.

Mercouri Kanatzidis, "Novel Chalcogenide Materials for x-ray and γ-ray Detection," Defense Threat Reduction Agency Technical Report (DTRA-TR-16-53), May 2016, pp. 1-63.

International Search Report and Written Opinion dated Dec. 28, 2017, pp. 1-13.

M. F. Churbanov et al., "Behavior of Impurity Inclusions during Vacuum Distillation of Tellurium," Inorganic Materials, vol. 37, No. 10, 2001, pp. 1017-1020.

* cited by examiner

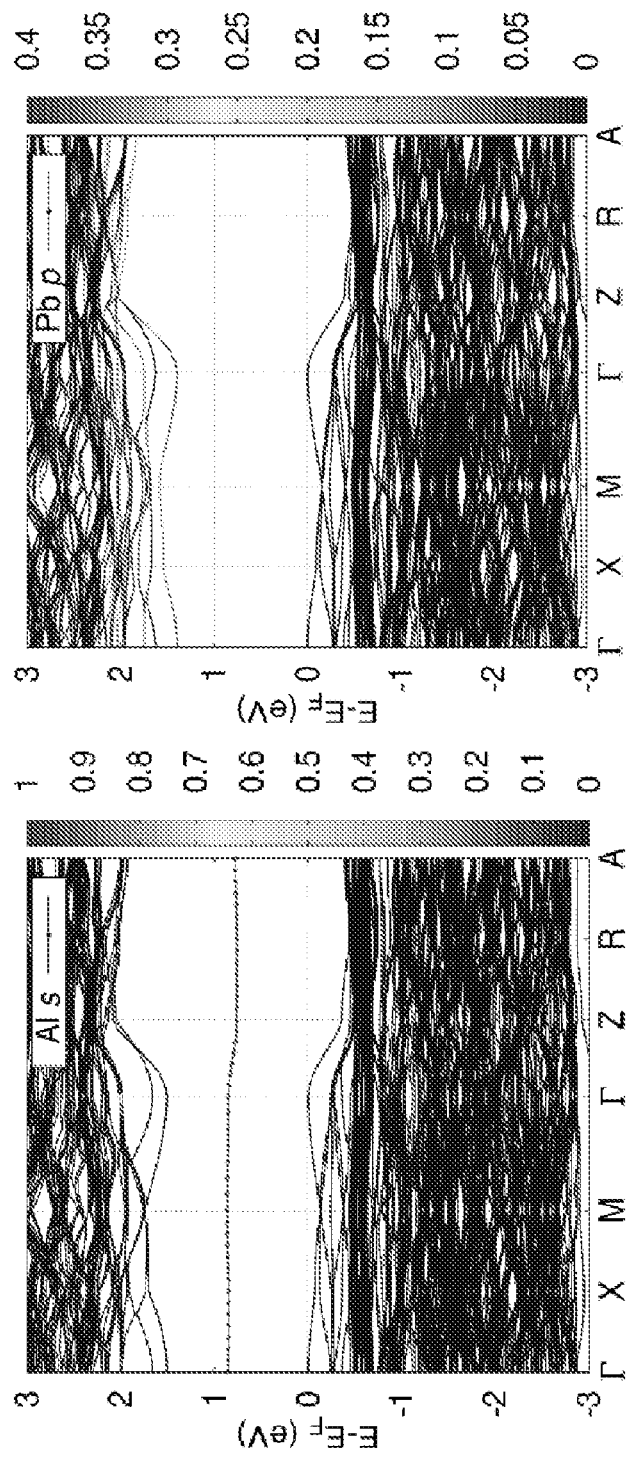

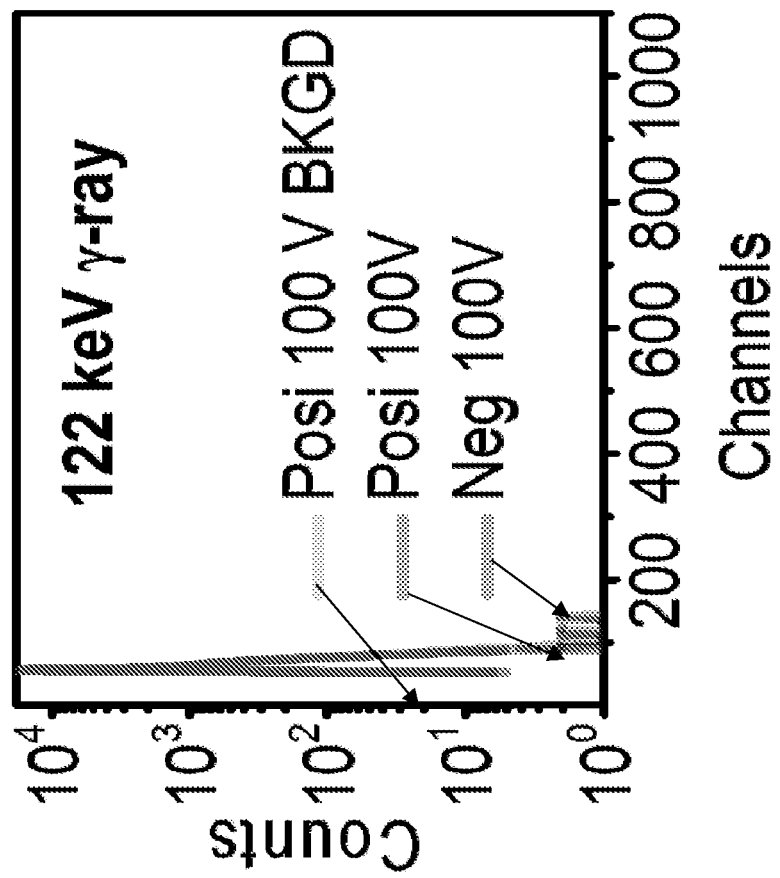

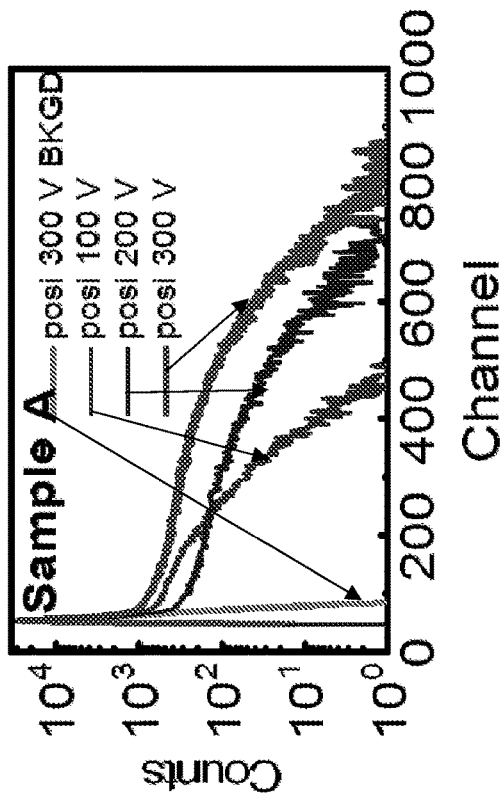
FIG. 9B
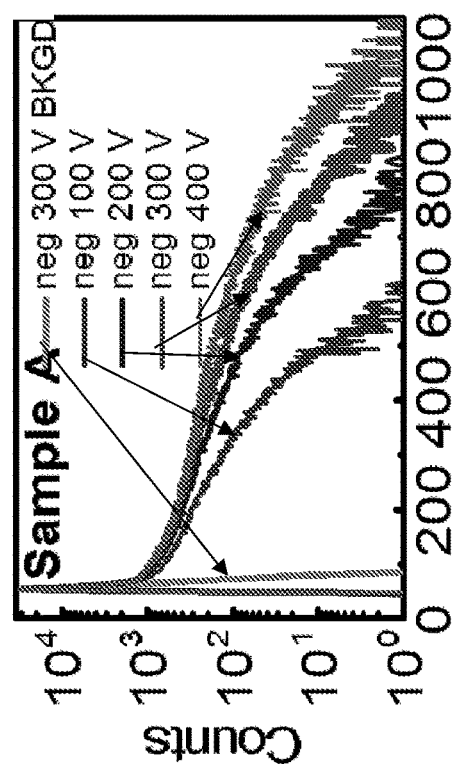
FIG. 9D
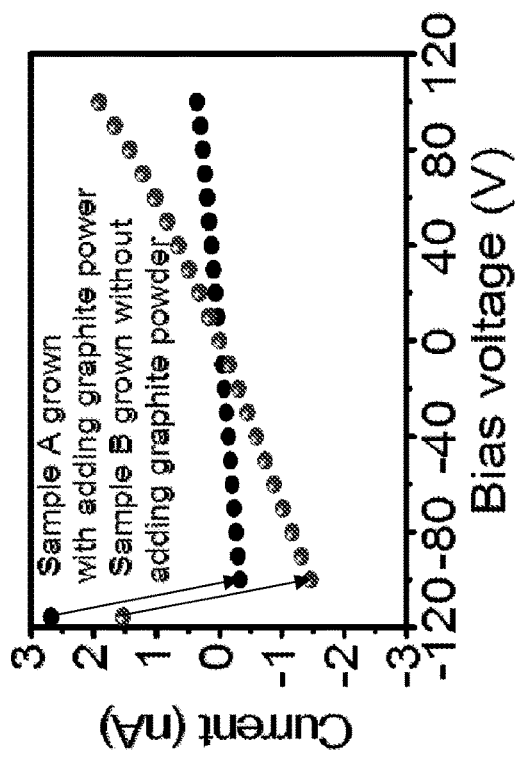
FIG. 9A
FIG. 9C

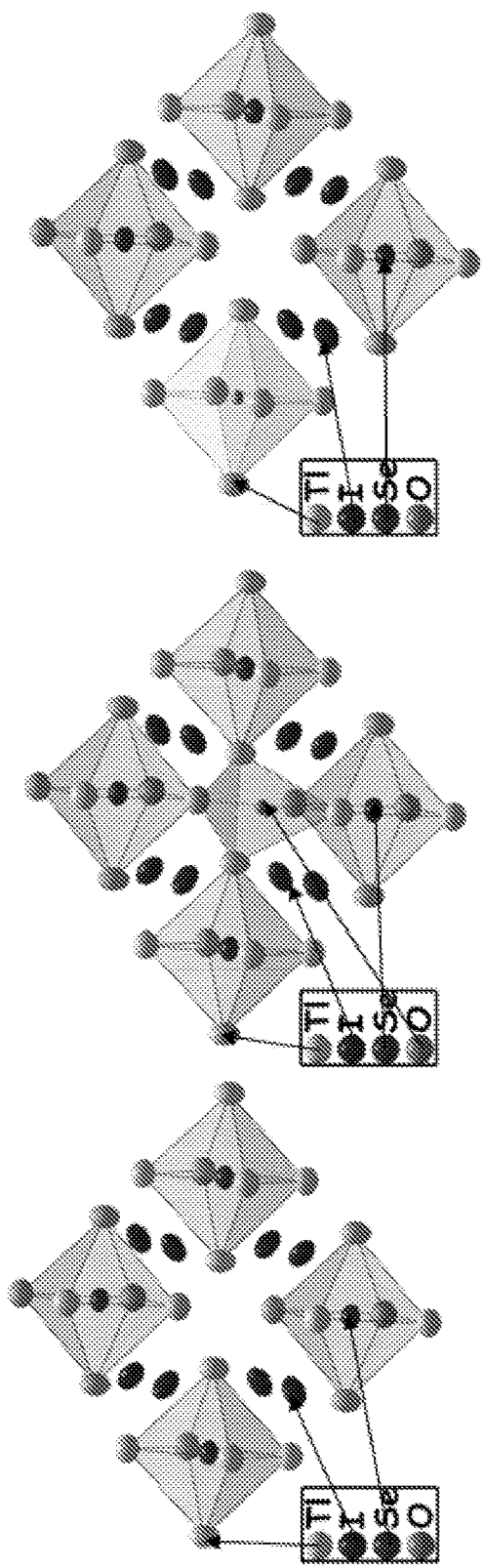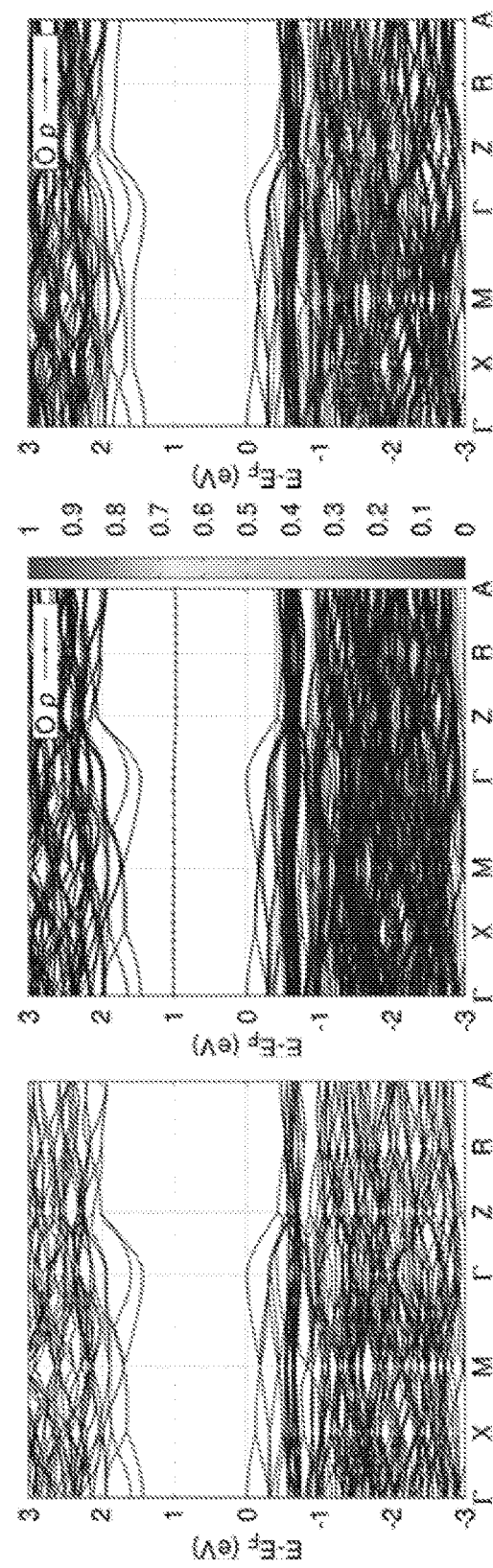
FIG. 15A  FIG. 15B  FIG. 15C

METHOD FOR PURIFYING AN INORGANIC MATERIAL USING A TUBE HAVING A BEND BETWEEN A FIRST END AND A SECOND END OF THE TUBE

CROSS-REFERENCE TO RELATED APPLICATIONS

The present application is a National Stage of International Application No. PCT/US2017/048653, filed Aug. 25, 2017, which claims priority to U.S. Provisional Patent Application No. 62/379,860 that was filed Aug. 26, 2016, the entire contents of which are hereby incorporated by reference.

REFERENCE TO GOVERNMENT RIGHTS

This invention was made with government support under HSHQDC-13-C-B0039 (subcontract C14-09 Radiation Monitoring Devices) awarded by the Department of Homeland Security. The government has certain rights in the invention.

BACKGROUND

Compound semiconductors are highly attractive for room temperature radiation detection applications, including homeland security, medical scanning, dirty bomb scanning and non-proliferation of nuclear materials. However, only a few semiconductor compounds have been identified as potential hard radiation detector materials, as a set of strict physical property requirements including high atomic number, high density, reasonable bandgap, and robust mechanical properties must be simultaneously satisfied to yield heavy radiation spectral responses.

High purity is important for obtaining high performance semiconductor detector materials, as impurities from precursors for crystal growth could result in the following consequences: (1) if impurities act as shallow donors or acceptors, they will lead to a decrease in resistivity; and (2) if impurities act as deep levels with large capture cross sections, they will become trapping centers for photo-induced electron-hole pairs, deteriorating the performance of detectors made from the crystals.

SUMMARY

Methods for purifying precursors used in the synthesis of inorganic compounds are provided. Also provided are methods for purifying the inorganic compounds, and methods of forming high quality crystals from melts of the inorganic compounds. γ-ray, X-ray, and α-particle detectors incorporating the crystals of the inorganic compounds are also provided.

One embodiment of a method for purifying an inorganic material comprises: loading a starting inorganic material comprising one or more impurity elements into a tube having a first end, a second end, and a body connecting the first end and the second end, wherein the body of the tube forms a bend between the first end of the tube and the second end of the tube; sealing the tube under vacuum; and mounting the tube in a furnace having a first temperature zone and a second temperature zone. The tube is mounted with its first end in the first temperature zone, its second end in the second temperature zone, and its bend directed upward, such that the bend is elevated above the first end of the tube and the second end of the tube and the first and second ends of the tube are directed downward. The temperature in the first temperature zone is then increased to a temperature that is sufficiently high to melt and volatilize the starting inorganic material in the first end of the tube, while maintaining the temperature in the second temperature zone at a temperature lower than the temperature in the first temperature zone. As a result, volatilized inorganic material condenses on a wall of body of the tube in the second temperature zone and flows down to the second end of the tube under the force of gravity. The condensed inorganic material that collects in the second end of the tube is then solidified to provide a purified inorganic material having a lower impurity concentration than the inorganic starting material. The angle of the bend is not critical, provided the tube is sufficiently bent to carry out the functions described above. By way of illustration only, the bend in the tube can form an angle of between about 160° and 100°.

One embodiment of a method for forming a purified thallium-containing compound from an oxidized thallium precursor material comprises: combining two or more solid starting inorganic precursor materials, at least one of which comprises thallium oxidation, with a carbon powder in a reaction vessel; sealing the reaction vessel under vacuum; and melting the two or more solid inorganic precursor materials. Carbon from the carbon powder reduces the thallium oxide of the oxidized thallium to form a reduced, thallium-containing inorganic precursor material, along with $CO(g)$ and $CO_2(g)$; and the two or more inorganic precursor materials, including the reduced, thallium-containing inorganic precursor material, react to form the thallium compound. The thallium compound can then be solidified to provide the purified thallium compound without thallium oxidation. The carbon powder may comprise, for example, graphite, graphene, or carbon nanotubes.

One embodiment of a method for reducing the phase segregation in a thallium-containing chalcogenide crystal or a thallium-containing halide crystal comprises: loading a thallium-containing chalcogenide compound or a thallium-containing halide compound into a tube, wherein the thallium-containing chalcogenide compound or the thallium-containing halide compound comprises one or more impurity elements; sealing the tube under vacuum; mounting the sealed tube in a furnace; melting and re-solidifying the thallium-containing chalcogenide compound or the thallium-containing halide compound to form a boule of the thallium-containing chalcogenide compound or the thallium-containing halide compound in the bottom of the tube; forming a molten zone through a narrow section of a bottom portion of the boule; and moving the molten zone upward through the boule to provide a purified boule. As the narrow section is moved upward, a solid plug of the thallium-containing chalcogenide compound or the thallium-containing halide compound is maintained above the molten zone, and the upward motion of the molten zone is discontinued before the molten zone reaches the top of the boule. Optionally, the lowermost portion of the purified boule can be removed, at least a portion of the purified boule can be re-melted, and a crystal of the purified thallium-containing chalcogenide compound or thallium-containing halide compound can be grown from the melt via Bridgman growth.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 4A depicts the electronic band structure of $Tl_6SeI_4$ 176-atom supercells containing defect $Al_{Tl1}^{1+}$. FIG. 4B depicts the electronic band structure of $Tl_6SeI_4$ 176-atom supercells containing defect $Pb_{Tl1}^{1+}$.

FIG. 6C shows 122 keV $^{57}$Co pulse height spectra obtained from sample B as a function of 100 V bias voltage under cathode and anode irradiation configuration. The grey line labeled as positive 100V BKGD refers to the signal background at 100V.

FIG. 9A shows current-voltage characteristics of $Tl_6SeI_4$ crystals grown with and without adding fine carbon powder. The inset is a typical fabricated detection device made from a $Tl_6SeI_4$ single crystal with a dimension of ~6 mm×3 mm. The thickness of the device is around 1.0 mm. FIG. 9B shows 122 keV $^{57}$Co spectral responses obtained from sample A as a function of various bias voltages under cathode irradiation (electron-collection) configuration. FIG. 9C shows 122 keV $^{57}$Co spectral responses obtained from sample A as a function of various bias voltages under anode irradiation (hole-collection) configuration. FIG. 9D shows 122 keV $^{57}$Co spectral responses obtained from sample B as a function of 100 V bias voltage. The grey line labeled as 100V BKGD refers to the signal background at 100 V.

FIG. 15A depicts the electronic band structure of $Tl_6SeI_4$ 176-atom supercells that are defect-free. FIG. 15B shows the electronic band structure of $Tl_6SeI_4$ 176-atom supercells that contain one interstitial oxygen atom. FIG. 15C shows the electronic band structure of $Tl_6SeI_4$ 176-atom supercells that contain one oxygen atom replacing an Se atom. The colors of the bands reflect the contributions from the Op states.

DETAILED DESCRIPTION

Figures 1, 2:
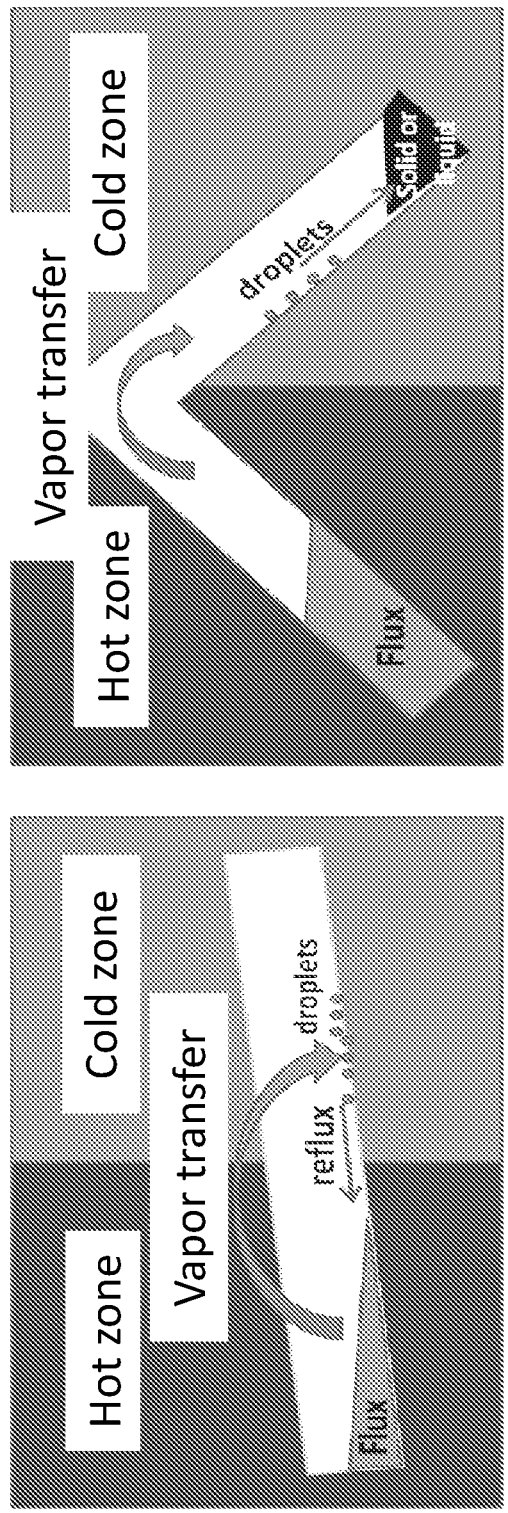
FIG. 1 depicts the principle of evaporation method in a straight ampoule.
FIG. 2 depicts the principle of evaporation method in a bent ampoule.

Methods for purifying reaction precursors used in the synthesis of inorganic compounds and methods for synthesizing inorganic compounds from the purified precursors are provided. Also provided are methods for purifying the inorganic compounds and methods for crystallizing the inorganic compounds from a melt. γ-ray, X-ray, and α-particle detectors incorporating the crystals of the inorganic compounds are also provided.

Inorganic compounds that can be synthesized from the purified reaction precursors include binary, ternary, and higher order inorganic compounds, such as metal chalcogenides, metal halides, and metal chalcohalides. For example, the precursors and synthesis methods described herein can be used to synthesize highly pure thallium-containing chalcogenides and chalcohalides. These include chalcohalides having the chemical formula $A_6BX_4$, wherein A is a metal, B is sulfur or selenium, and X is a halide. Members of this class of chalcohalides include thallium-based chalcohalides, such as $Tl_6SI_4$, $Tl_6SBr_4$ and $Tl_6SeI_4$.

$Tl_6SI_4$ crystallizes in the tetragonal P4/mcm space group, with a calculated density of 7.26 g/cm$^3$. As illustrated in Example 3, crystalline $Tl_6SI_4$ can be grown from purified precursors in a two-zone vertical Bridgman furnace.

The Examples describe the purification processes using $Tl_6SI_4$ and $Tl_6SeI_4$ as illustrations. However, the purification processes in the Examples can be modified to form other purified inorganic compounds, including other thallium-based metal chalcohalides, by substituting in the appropriate elemental and compound precursors. Other thallium-based metal chalcohalides that can be synthesized using these methods include $Tl_4HgI_6$, $TlGaSe_2$, $TlBr$, $Tl_4AsSe$, $Tl_3AsSe_3$, $TlInSe_2$, $TlSn_2I_5$, and $TlPbI_3$. Examples of precursor for the synthesis of $Tl_4HgI_6$ include: (a) Tl, Hg, $I_2$; (b) $Tl+I_2+HgI$; (c) $TlI+HgI_2$; (d) $TlI+Hg+I_2$. Examples of precursor for the synthesis of $TlGaSe_2$ include: (a) $Tl+Ga+Se$; (b) $Tl_2Se+Ga+Se$; (c) $Tl+Se+Ga_2Se_3$; (d) $Tl_2Se+Ga_2Se_3$. Examples of precursor for the synthesis of $Tl_3AsSe_3$ include: (a) $Tl+As+Se$; (b) $Tl_2Se+As+Se$; (c) $Tl+Se+As_2Se_3$; (d) $Tl_2Se+As_2Se_3$; Precursor for $TlInSe_2$ can be: (a) $Tl+In+Se$; (b) $Tl_2Se+In+Se$; (c) $Tl+Se+In_2Se_3$; (d) $Tl_2Se+In_2Se_3$. Examples of precursor for the synthesis of $TlSn_2I_5$ include: (a) $Tl+Sn+I_2$; (b) $TlI+Sn+_{12}$; (c) $Tl+I_2+SnI_2$; (d) $TlI+SnI_2$. Examples of precursor for the synthesis of $TlPbI_3$ include: (a) Tl, Pb, $I_2$; (b) $Tl+I_2+PbI_2$; (c) $TlI+PbI_2$; (d) $TlI+Pb+I_2$.

The purified precursors may be used as reactants for the synthesis of the inorganic compounds in a stoichiometric melt, that is—a melt in which the reactants are present in appropriate stoichiometric ratios to form the desired compounds. Once formed, the inorganic compounds can be solidified and used as raw materials for the growth of high-quality crystals. The precursors can comprise elemental precursors, binary precursors, ternary precursors, higher order precursors, and combinations thereof. The composition of the precursors will depend on the inorganic compounds to be synthesized. Examples of suitable precursors include metals, such as transition metals, semi-metals, halides, metal halides, and metal chalcogenides.

Thallium-containing precursors for use in the synthesis of high purity thallium-containing inorganic compounds include: thallium-containing chalcogenides, such as $Tl_2S$ and $Tl_2Se$; thallium-containing halides, such as TlX, wherein X is a halide element or a combination of halide elements, for example TlI; and elemental precursors, such as Tl (metal), S, Se, and $I_2$.

Using the present methods, impurities can be removed from the precursors and from the inorganic compounds that are synthesized from the precursors. The impurities may be trace elements that are present in the commercially available precursors or that are introduced during synthesis, handling and/or storage. As illustrated in Example 1, such impurities include metal elements, semi-metal elements, semiconductor elements, halide elements, and alkaline earth elements. Notably, the methods can be used to reduce the concentration of, or eliminate, impurity elements that introduce deep electronic levels in the bandgaps of the inorganic compounds made from the precursors. The methods can also be used to reduce the concentration of, or eliminate, impurity elements that introduce shallow electronic levels. Examples of impurities than can form deep levels in thallium chalcohalides, such as $Tl_6SI_4$ and $Tl_6SeI_4$, include Al, Bi, Pb, and Si.

Oxygen, in the form of oxides, can also be removed from the precursors and from the product inorganic compounds, as illustrated in Example 2. This is significant because, in some inorganic compounds, such as thallium chalcohalides, the presence of interstitial oxygen atoms can lead to the formation of a deep level located near the middle of the bandgap, and can act as carrier trap. The purification methods can be carried out repeatedly in order to achieve a desired degree of purity. In addition, different methods can be combined to achieve an ultrapure product. For example, precursors having elemental impurities can be purified separately from oxidized precursors. The purified precursors can then be reacted in a melt to form the inorganic compound, which can then also be subjected to further purification, as illustrated in the Example below. In embodiments of the methods used to purify chalcohalide compounds that include S and/or Se atoms, the oxygen concentration can be reduced below the concentration of intrinsic S and/or Se vacancies in the compounds. Moreover, by purifying the inorganic compounds synthesized from the precursors, it is possible to reduce the degree of phase segregation in crystals that are grown from a melt of the purified inorganic compounds, as illustrated in Example 4.

In some embodiments of the methods, the concentration of one or more of the impurities (for example, one or more of the impurities that form deep levels or shallow levels) that are initially present in the starting precursors is reduced by a factor of at least five. This includes embodiments of the methods that reduce the concentration of one or more of the impurities by a factor of at least 10, by a factor of at least 100, or by a factor of at least 1000. As a result, the impurity concentration for the one or more impurities in at least some embodiments of the purified precursors is no greater than 0.1 ppm (weight); no greater than 0.05 ppm (weight); or no greater than 0.01 ppm (weight). At least some embodiments of the inorganic compounds made from the purified precursors have impurity levels of no greater than 1 ppm (atomic). At least some embodiments of the inorganic compounds made from the purified precursors have impurity levels of no greater than 100 ppm. This includes embodiments of the inorganic compounds that have impurity levels of no greater than 80 ppm (weight), no greater than 60 ppm (weight), no greater than 55 ppm (weight), no greater than 50 ppm (weight), no greater than 40 ppm (weight), and no greater than 30 ppm (weight). In some embodiments of the inorganic compounds, the level of impurities that form deep electronic levels in the bandgap of the inorganic compounds is no greater than 0.5 ppm; no greater than 0.1 ppm (weight); no greater than 0.05 ppm (weight); or no greater than 0.01 ppm (weight).

The ultra-pure inorganic compounds, which are generally formed as polycrystalline materials, can be re-melted and crystallized using methods such as Bridgman growth, as illustrated in the examples below. The ultra-pure single crystals of the inorganic compounds can then be used as photo-responsive materials in a γ-ray detector, an X-ray detector, or an α-particle detector. The impurity levels can be measured via GDMS, as described in the Examples.

The high purities of the inorganic compounds can be reflected in their high resistivities and high charge carrier mobilities. For example, embodiments of single crystals of the purified inorganic compounds, including thallium chalcohalides, have resistivities of at least $1\times10^{12}$ Ω·cm. This includes single crystals of the purified inorganic compounds, including thallium chalcohalides, having resistivities of at least $2\times10^{12}$ Ω·cm, at least $3\times10^{12}$ Ω·cm, and at least $5\times10^{12}$ Ω·cm. Some embodiments of single crystals of the purified inorganic compounds, including thallium chalcohalides, have hole mobilities of at least 90 cm$^2$ V$^{-1}$ s$^{-1}$ and/or electron mobilities of at least 25 cm$^2$ V$^{-1}$ s$^{-1}$. This includes single crystals of the purified inorganic compounds, including thallium chalcohalides, having electron mobilities of at least 60 cm$^2$ V$^{-1}$ s$^{-1}$, and at least 80 cm$^2$ V$^{-1}$ s$^{-1}$.

Some embodiments of the detectors comprise: an ultra-pure, crystallized inorganic compound that is capable of absorbing incident radiation and generating electron-hole pairs; a first electrode in electrical communication with the crystallized compound; and a second electrode in electrical communication with the crystallized compound. In such devices, the first and second electrodes are configured to apply an electric field across the crystallized material. The devices can further comprise one or more additional electronic components configured to measure a signal generated by the electron-hole pairs that form upon exposure of the crystallized material to the incident radiation. The incident radiation can comprise wavelengths in the γ region of the electromagnetic spectrum (i.e., wavelengths in the range from about $1\times10^{10}$ to about $2\times10^{-13}$ meters), in the X-ray region of the electromagnetic spectrum (i.e., wavelengths in the range from about 0.01 to 10 nanometers), or both. For example, embodiments of the detectors shows a photoresponse under Ag Kα X-rays (22.4 keV), γ-rays from $^{57}$Co (122 keV), and/or α-particles from $^{241}$Am (5.5 MeV).

Unless otherwise specified or indicated, the values of any properties recited in this disclosure that are affected by temperature or pressure, refer to those values at room temperatures (~ 23° C.) and atmospheric pressure. The following Examples are intended to illustrate certain embodiments of the purification methods. Although theories of the inventions may be presented in the Examples, the inventors do not intend to be bound by any particular theories of the invention.

Example 1

The purification of volatile materials by evaporation has normally been performed using a straight ampoule (tube) mounted into a two-zone furnace. As shown in FIG. 1, the volatile material to be purified was first loaded in one side of a tube made of silica or glass. Second, the tube was vacuum sealed. Third, the sealed tube was nearly horizontally mounted into a two-zone furnace. The side loaded with material was located in the hot zone of the furnace where the temperature is higher than the melting point of the material, while the other side was located in the cold zone where the temperature was lower than the melting point. Owing to the temperature gradient between the hot and cold zones, vapor transport could be realized. The saturated vapor from the hot zone became oversaturated in the cold zone, and then condensed into droplets. These droplets finally solidified after some time, and the nonvolatile impurities were left in the hot zone. In this way, purification by evaporation was accomplished. However, the efficiency of this technology has not been satisfactory, due to a technical problem caused by the reflux of liquid droplets. As a result, most of droplets flowed back to the hot zone before condensation and solidification due to gravity, as shown in FIG. 1. Additionally, this method is found to be impractical for the purification of some compounds that decompose when melted. For example, when the final products are Tl$_2$Se and TlI when this method is applied in an attempt to form purified Tl$_6$SeI$_4$, since the Tl$_6$SeI$_4$ melt decomposes into Tl$_2$Se and TlI vapor.

In order to increase the evaporation efficiency and avoid phase segregation, an evaporation method was developed. As shown in FIG. 2A, the ampoule made of silica and glass was bent in the middle section using a flame, and then a half tube was loaded with material to be purified. Second, the tube was sealed under vacuum using a flame. Third, the tube was vertically mounted into a two-zone furnace. The half of the tube loaded with material was located in the hot zone of the furnace, while the other half of the tube was located in the cold zone of the furnace. In order to evaporate the material to be purified, the temperature of the hot zone was set higher than the melting point of the material. On the other hand, in order to ensure vapor transfer between the hot and cold zones, the temperature of the cold zone was set lower than that of the hot zone. Once molten, the material began to vaporize. Owing to the temperature gradient, the saturated vapor condensed as droplets. Due to gravity, these droplets flowed along the inner wall of the tube and accumulated at the other end of the tube. In this way, the reflux of droplets could be avoided, and higher efficiency of purification could be realized. Additionally, this method can be used to avoid phase segregation, since all the vaporized components accumulate in the cold end and form the product without decomposition.

In this Example, the evaporation in a bent tube method was applied to purify S, Se, Tl$_2$S, Tl$_2$Se and TlI precursors for growing Tl$_6$SI$_4$ and Tl$_6$SeI$_4$ crystals for hard radiation detection. In addition, the effectiveness and efficiency of purification by the evaporation in a bent tube method was evaluated.

Experimental Section

Synthesis

The commercially bought S (99.999%, 5N Plus Inc.), Tl (99.999% metals basis, Alfa Aesar) and TlI (99.999%, Alfa Aesar) were used as precursors for growing Tl$_6$SI$_4$. Synthesis of Tl$_2$S precursor was performed by combining Tl and S with a molar ratio of 2:1 in a flat-bottomed, carbon-coated fused silica tube under a 10$^{-4}$ mbar vacuum and reacting them for 20 h in 500° C. The commercially bought Tl metal contained one black oxide layer, due to the sensitivity of Tl to air. Before the synthesis of Tl$_2$S, a blade was used to scrape this black oxide layer on the Tl precursor to remove the oxidation layer. To make Tl$_6$SI$_4$, Tl$_2$S and TlI were combined in a stoichiometric ratio in a glovebox under an inert N$_2$ atmosphere. These starting materials were sealed in a fused silica tube and reacted at 550° C. for 20 h. Because of the sensitivity of Tl, Tl$_2$S and Tl$_6$SI$_4$ to air, it was necessary to perform the handling process in a glovebox under an inner N$_2$ atmosphere at all times. Due to the sensitivity of the Tl precursor, the commercially bought Tl metal always contained a Tl$_2$O$_3$ oxidation layer on the surface. The Tl$_2$O$_3$ could react with an ampoule made of silica, which could lead to tube breakage and sticking. In addition, Tl$_2$O$_3$ impurity could introduce parasitic nucleation sites during crystal growth, leading to polycrystalline crystallization behavior. Thus, a blade was used to remove the oxidation layer until the surface of the Tl became shiny.

Commercially bought Se (99.999%, 5N Plus Inc.), Tl (99.999% metals basis, Alfa Aesar) and TlI (99.999%, Alfa Aesar) were used as precursors for growing Tl$_6$SI$_4$. Synthesis of Tl$_2$Se precursor was performed by combining Tl and Se (99.999%, 5 N Plus Inc.) with a molar ratio of 2:1 in a flat-bottomed, carbon-coated fused silica tube under a 10$^{-4}$ mbar vacuum and reacting them for 20 h in 500° C. The commercially bought Tl metal comes with one black oxide layer, as Tl is very sensitive to air.

The synthesis of $Tl_6SeI_4$ polycrystalline raw material was performed by the direct combination of purified $Tl_2Se$ and TlI binary precursors in an evacuated silica ampoule at 520° C. for 12 h in a rocking furnace, followed by slow cooling to room temperature in 12 h. The heating temperature of 520° C. for synthesis ensured complete melting of $Tl_6SeI_4$. After synthesis, the ternary raw material was put into a conical-tipped fused silica ampoule with an inner diameter of 11 mm, which was then sealed at a vacuum pressure of $1 \times 10^{-4}$ mbar. A single crystalline ingot of $Tl_6SeI_4$ was grown by the vertical Bridgman method. At the beginning of the growth process, the ampoule was held in the hot zone (600° C.) of a two-zone Bridgman furnace for 12 h to achieve complete melting of polycrystalline raw material. The ampoule was subsequently translated from the hot zone to the cold zone at a speed of 0.5 mm/h. In order to generate a temperature gradient of 30° C./cm, the temperature of the cold zone was set at 200° C. After crystal growth, the ingot was annealed in-situ at 300° C. for 24 h inside the Bridgman furnace without translation. Finally, the ingot was cooled down to room temperature within 24 h to avoid cracks caused by thermal stress. In order to evaluate the effectiveness of purification on the impurity concentration and detection performance, another batch of $Tl_6SeI_4$ raw material for crystal growth was also synthesized with the commercially available Tl, Se and TlI precursors without further purification. The unpurified $Tl_6SeI_4$ raw material was also subject to crystal growth under identical conditions.

Detector Device Fabrication and Charge Transport Measurements.

The Bridgman-grown $Tl_6SeI_4$ ingots were cut perpendicular to the growth direction using a diamond saw. One wafer was extracted from the middle section of each ingot. The sample prepared with purified precursors was labeled "sample A," while the reference sample grown with raw material without purification was labeled "sample B." Subsequently, samples A and B were polished with silicon carbide sand paper and alumina slurries with a particle size of 0.05-1 µm. No further surface etching and passivation were performed on the polished surface. The sample was mounted on a 1-square-inch insulating glass substrate. The electrodes were fabricated by applying fast-dry Ag paint purchased from TED Pella. The diameter of the electrode on the top of the sample was around 2 mm, while the whole area of the bottom of the sample was covered by the Ag paint for the bottom electrode. Cu wires were attached to the contacts made by the Ag paint, and then attached to Cu foil strips on the glass substrate. The thicknesses of the devices made of the two samples were around 1.0 mm, and the sample dimensions were about 3 mm×5 mm. The direct current (DC) current-voltage (I-V) measurements were performed in the dark to assess the leakage current. DC conductivity was measured on a Keithley 6517B electrometer and a Keithley 6105 resistivity adapter. Electromagnetic interference and photoconductive responses were eliminated by a metallic enclosure. In order to estimate the photoresponse to X-rays, photocurrent measurements were performed using 22 keV Ag X-rays generated from a CPS 120 INEL diffractometer operating at an accelerating voltage of 40 kV and a current of 2 mA.

Hard Radiation Performance Characterization.

Detector performance was probed using a 0.3 mCi $^{57}Co$ source generating 122 keV γ-rays. The fabricated device was connected to an eV-550 preamplifier box. The signals were transferred to an ORTEC amplifier (Model 572A) with a gain of 200, shaping time of 0.5 µs, and collection time of 300 s before they were evaluated by a dual 16 K input multichannel analyzer (Model ASPEC-927) and read into the MAESTRO-32 software. The measurements were carried out in the atmosphere, and the distance between the $^{57}Co$ radiation source and the detector was around 5 cm. Pulse height spectra without a radiation source were collected as background noise under the same experimental conditions.

Carrier Mobility Estimation.

An un-collimated $^{241}Am$ α-particle source was used for mobility estimation. The activity of the alpha source was around 1.0 µCi. The measurements were carried out in the atmosphere with a source-detector distance of ~2 mm. The electron and hole mobility of the $Tl_6SeI_4$ detector were estimated by measuring the carrier drifting time ($t_{drift}$) from an interaction close to the cathode/anode as the carriers drifted for the entire thickness of the detector. (See, Erickson, J. C., et al., Time of flight experimental studies of CdZnTe radiation detectors. *J Electron Mater* 2000, 29 (6), 699-703; Sellin, P. J., et al., Drift mobility and mobility-lifetime products in CdTe:Cl grown by the travelling heater method. *IEEE Trans. Nucl. Sci.* 2005, 52 (6), 3074-3078; and Szeles, C., CdZnTe and CdTe materials for X-ray and γ-ray radiation detector applications. *Physica Status Solidi* (b) 2004, 241 (3), 783-790.) The µ can be estimated by the following equation:

$$\mu = \frac{D}{Et_{drift}}$$

where D and E are the detector thickness and the applied electric field, respectively. The carrier drifting time $t_{drift}$ is measured by recording the carrier rise time from output pulse from preamplifier. In order to enhance the reliability and accuracy of the data, 50 measurements of the carrier rise time were performed and averaged. For carrier mobility measurements, the complete transient waveforms from the preamplifier with a maximum time resolution of 4 ns were recorded by using a custom interface based on National Instruments software. Every transient waveform was analyzed to determine the rise time corresponding to the transit time between 10% and 90% of the amplitude of the transient pulses.

Purification

Purification of the $Tl_6SI_4$ raw material was conducted by horizontal zone refining. Twenty grams of $Tl_6SI_4$ raw material were loaded into a carbon-coated fused silica tube with an inner diameter of 8 mm, an outer diameter of 11 mm, and a length of 80 mm. The refining was conducted in a horizontal configuration at a travelling speed of 20 mm/h for 33 passes. The width of the molten zone was estimated to be 15 mm according to the temperature field. In order to ensure complete melting of $Tl_6SI_4$, the controlling temperature of the zone refining was set at 550° C., which is higher than the melting point (427° C.) of $Tl_6SI_4$. After zone refining, the seed part (which was first solidified) and the tail part were extracted for phase determination via powder X-ray diffraction measurements. The $Tl_6SeI_4$ was also purified under the above experimental conditions.

An evaporation in a bent tube method was applied to purify S, Se, $Tl_2S$, $Tl_2Se$ and TlI. Before evaporation, TlI was preheated under vacuum of $10^{-2}$ mbar at 76° C. for 24 h in order to remove surface moisture. Five fused silica tubes, each with a length of 300 mm, an inner diameter of 11 mm, and an outer diameter of 15 mm, were bent using a flame at the middle part. The angle between the two semi-tubes was around 120° C. Twenty grams of S, Se, Tl$_2$S, Tl$_2$Se, and TlI, respectively, were loaded into the bent tubes, and then the tubes were sealed under a 10$^{-4}$ mbar vacuum. Each bent tube was mounted into a two-zone furnace in a horizontal configuration, as shown in FIG. 2. The temperature difference between the hot and cold zones ensured effective transport of vapor. The hot and cold zone temperatures set for the two-zone furnace are shown in Table 1. After complete material transport, purified precursors were collected in the cold zone. The parallel experiments were conducted by the evaporation in a straight tube method in order to compare the difference between the efficiencies of the evaporation in a straight tube method versus the evaporation in a bent tube method.

TABLE 1

Temperatures set for hot and cold zones in a two-zone furnace and melting and boiling points of precursors.

| Precursors | Temperature for hot zone (° C.) | Temperature for cold zone (° C.) | Melting point (° C.) | Boiling point (° C.) | Temp. Gradient Estimated (° C.-(m$^{-1}$) |
|---|---|---|---|---|---|
| S | 310 | 200 | 115 | 444 | |
| Se | 540 | 300 | 221 | 685 | 12 |
| TlI | 840 | 520 | 442 | 823 | 17 |
| Tl$_2$S | 800 | 650 | 448 | 1367 | |
| Tl$_2$Se | 1000 | 500 | 380 | N/A | 25 |

During the handling of the material and preparation of the quartz ampoules, certain impurities could become incorporated. Thus, the quartz ampoules used for synthesis and purification were etched in HF acid solution to remove surface contamination. First, the ampoule was etched in 2% HF+5% HNO3 solution for more than 2 h in order to remove metal and metal oxide contaminants. Second, the ampoule was rinsed with deionized water 3 times in an ultrasonic bath. Finally, the ampoule was rinsed with acetone twice in an ultrasonic bath and dried in a fume hood before it was transferred to a dry box.

Characterizations

Impurity Analysis.

Impurity analysis was performed before and after purification to check the effectiveness of purification by the evaporation in a bent tube method. The purified precursors were extracted from the cold zone, and then analyzed by Glowing Discharge Mass Spectrometry (GDMS) measurement. Positive Ar$^+$ ions were accelerated onto the sample to generate erosion and atomization of the surface of sample. The sputtered species from the sample surface were ionized by plasma, and then extracted into a mass spectrometer where they were identified and measured. In order to increase the conductivity of sample, the sample was crushed into small pieces and embedded into high-purity indium metal, which is very conductive. The accuracy of GDMS measurements is in the range of 1 part per million (ppm) to 0.1 part per billion (ppb), depending on the host material and the specific impurity.

Phase Determination.

In order to check whether severe phase segregation occurred after purification, powder X-ray diffraction (PXRD) patterns of ground samples were conducted using a CPS 120 INEL diffractometer.

Stoichiometry Assessment.

The stoichiometry of TlI, Tl$_2$S and Tl$_2$Se were analyzed using a Hitachi S4800-II scanning electron microscope (SEM) equipped with an energy dispersive spectroscopy (EDS) detector. The stoichiometry of purified Tl$_2$Se and TlI were analyzed using a Hitachi S4800-II electron microscope (SEM) equipped with an energy-dispersive spectroscopy (EDS) detector.

Electronic Band Structure Calculations.

First-principles total energy calculations within the density functional theory (DFT) framework were employed to investigate the electronic structure of impurities in Tl$_6$SeI$_4$. The Projector Augmented Wave method implemented in Vienna Ab-initio Simulation Package was employed. (See, Blöchl, P. E., Projector augmented-wave method. *Physical Review B* 1994, 50 (24), 17953-17979; Kresse, G., et al., Efficient iterative schemes for ab initio total-energy calculations using a plane-wave basis set. *Phys Rev B* 1996, 54 (16), 11169-11186; and Kresse, G., et al., Ab-Initio Molecular-Dynamics Simulation of the Liquid-Metal Amorphous-Semiconductor Transition in Germanium. *Phys Rev B* 1994, 49 (20), 14251-14269.) The energy cut off for the plane wave basis was set to 350 eV. The exchange-correlation contribution to the potential was included using the generalized gradient approximation (GGA) within the Perdew-Burke-Ernzerhof (PBE) functional. (See, Perdew, J. P., et al., Generalized Gradient Approximation Made Simple. *Phys Rev Lett* 1996, 77 (18), 3865-3868.) To describe the isolated defects and impurities, 2×2×2 supercells containing 176 atoms and a 3×3×3 k-point mesh were utilized. The internal atomic positions of the defect structures were fully relaxed until the residual forces on atoms were less than 0.01 eV/Å while the lattice parameters of the supercells remained fixed.

Result and Discussion

Purification of Polycrystalline Tl$_6$SI$_4$/Tl$_6$SeI$_4$ Raw Material by Multi-Pass Horizontal Zone Refining.

Figure 3:
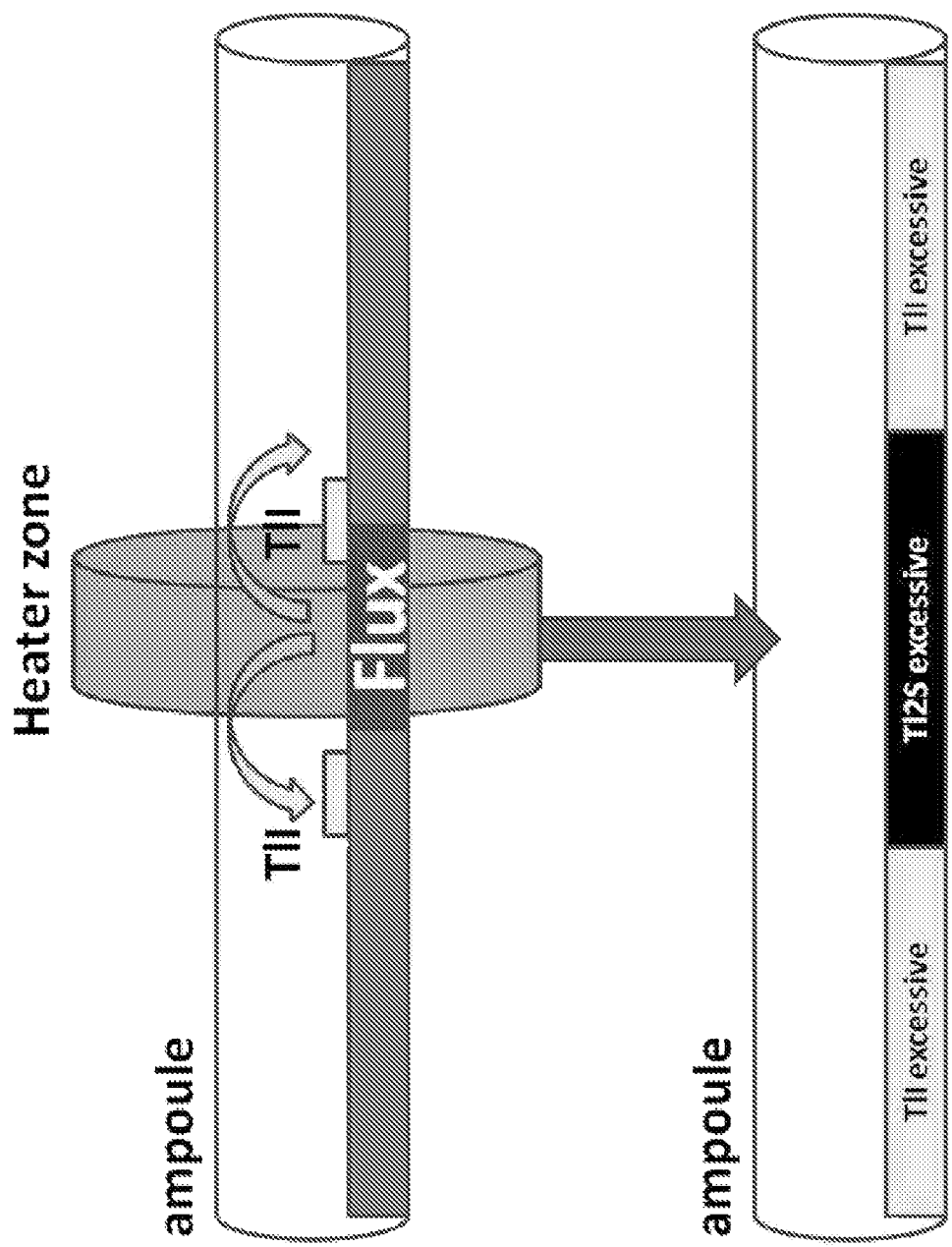
FIG. 3 depicts the severe phase segregation after purification on ternary compounds by multi-pass horizontal zone refining.

Multi-pass zone refining of Tl$_6$SI$_4$ was conducted. For horizontal zone refining (FIG. 3) the seed section (first to solidify) and tail section were found to be yellow. This clearly indicated severe off-stoichiometry during horizontal zone refining. PXRD measurements were performed on the yellow substances extracted from the tail and seed sections of the ingot. If the molten ternary compound was decomposing, and then losing its volatile component-TlI, the TlI vapor generated in the decomposition reaction would be transferred by the temperature difference between the two sides of the zone refiner, as shown in FIG. 3. Therefore, the horizontal zone refining of Tl$_6$SI$_4$ was very challenging and impractical because of the decomposition of the ternary compound into its binary component TlI and Tl$_2$S in the non-uniform temperature distribution of the zone refiner and the large open vapor above the ingot. The decomposition of Tl$_6$SeI$_4$ also occurred as a result of direct purification by horizontal zone refining.

Since it is impractical to purify the ternary compound by horizontal zone refining, the purification of elementary and binary precursors was investigated.

Purification of S Precursor by Evaporation in a Bent Tube Method.

Twenty grams S with a 5N purity could be transferred to the cold zone in less than 30 min. Thus, this method showed a high efficiency in purifying S. Some black substance was left in the hot half end of the ampoule. The occurrence of an additional XRD pattern of the black material could be indexed to amorphous graphite. The commercially bought S pieces contained hydrocarbon which yielded carbon once heated.

Table 2 shows the comparison of impurity analyses of S before and after purification by using GDMS. The evaporation in a bent tube method was shown to be highly effective in eliminating most of the main impurities, such as Na, B, Mg, Al, K, Ca and Bi.

TABLE 2

Comparison of impurity analyses of S precursor before and after purification. (↑: increase ↓: decrease →: almost no change)

| Impurities | Impurity concentration before purification (ppm, wt) | Impurity concentration after purification (ppm, wt) | Tendency |
|---|---|---|---|
| Li | <0.05 | <0.01 | ↓ |
| Na | 0.50 | <0.05 | ↓ |
| B | 0.18 | <0.01 | ↓ |
| Mg | 0.09 | <0.01 | ↓ |
| Al | 0.09 | <0.01 | ↓ |
| Si | 1.3 | 1.6 | → |
| Cl | ~2 | <0.1 | ↓ |
| K | 0.63 | <0.1 | ↓ |
| Ca | 3.5 | <0.1 | ↓ |
| Fe | 0.45 | <0.01 | ↓ |
| Cu | <0.1 | 0.04 | ↓ |
| Zn | <5 | <0.5 | ↓ |
| Ga | <0.5 | <0.01 | ↓ |
| Ge | <5 | <0.01 | ↓ |
| Se | <0.5 | 0.27 | → |
| Ag | <0.1 | <0.05 | → |
| Sn | <0.5 | 0.1 | ↓ |
| Te | <0.5 | 0.12 | ↓ |
| I | <5 | <0.01 | ↓ |
| Hg | <1 | <0.01 | ↓ |
| Pb | <0.5 | <0.01 | ↓ |
| Bi | 0.2 | <0.01 | ↓ |

Purification of Se Precursor by Evaporation in a Bent Tube Method.

Twenty grams Se with a 5N purity could be transferred to the cold zone in less than 10 min. This method showed a high efficiency in purifying S, since some black impurity was left in the hot half end of the ampoule.

Table 3 shows the comparison of impurity concentrations of Se before and after purification. As mentioned above, the Se raw material was subject to purification via one-time evaporation in a bent tube.

TABLE 3

Comparison of impurity concentrations of Se before and after purification (↑: increase ↓: decrease →: almost no change).

| Impurities | Impurity concentration before purification (ppm, wt) | Impurity concentration after purification (ppm, wt) | Tendency |
|---|---|---|---|
| Na | 0.09 | 0.19 | ↑ |
| Si | 0.24 | 1.2 | ↑ |
| Cl | 18 | 0.31 | ↓ |
| K | <0.5 | 1.1 | ↑ |
| Ca | 0.16 | <0.05 | ↓ |
| Br | <0.5 | 1.3 | ↑ |
| Sn | 0.24 | 0.2 | → |
| Te | 0.6 | 0.22 | ↓ |
| Pb | 0.59 | 0.1 | ↓ |
| Bi | 0.03 | 0.01 | ↓ |

As shown above, the evaporation method seemed to be highly effective in eliminating Cl, Ca, Te, Pb and Bi. The concentrations of Na, K and Si increased after purification. The Se was probably contaminated by Na, K and Si from the ampoule.

Purification of TlI Precursor by Evaporation in a Bent Tube Method.

A one-time purification cycle on a Tl ingot was performed. The transport of 20 g of TlI required only 20 min, indicating that the evaporation in a bent tube method was highly efficient. Compositional analysis by EDS revealed that the purified TlI was stoichiometric.

After evaporation, small black spots were present on the ampoule inner wall, particularly where the periphery of the molten pool of TlI was initialized. These contamination residues were typical signatures of the purification effect. In order to assess the purity of the evaporated TlI, one sample from the thin end of the ingot was selected for impurity analysis by GDMS.

Table 4 shows the impurity concentrations in TlI measured by GDMS. The columns from left to right show the purity of TlI after melting in a silica ampoule and the purity of TlI after purification by the evaporation in a bent tube method.

TABLE 4

Comparison of impurity concentrations in TlI before and after purification (↑: increase ↓: decrease →: almost no change).

| Impurities | Impurity concentration before purification (ppm, wt) | Impurity concentration after purification (ppm, wt) | Tendency | Comments |
|---|---|---|---|---|
| Si | <0.05 | 0.13 | ↑ | Contamination |
| Cl | 1.9 | 0.63 | ↓ | Effective |
| Ca | <0.1 | 0.03 | → | |
| Fe | 0.02 | <0.01 | ↓ | Effective |
| Br | 76 | 48 | ↓ | Effective |
| Sn | 0.26 | <0.1 | ↓ | Effective |

These results show that the distillation/evaporation method was found to be very effective for eliminating Cl, Fe, Br, and Sn. The concentration of Si increased after purification, indicating that the TlI was probably contaminated by the silica ampoule.

Morphology observation and compositional analysis for TlI purified by a one-time evaporation method was performed by SEM-EDS, which showed many shallow voids distributed throughout the surface of TlI. These holes had a uniform size of around 10 μm. EDS results showed that the composition of matrix and shallow hole was nearly stoichiometric to TlI. No oxide impurities were detected by EDS on the surface.

Purification of Tl$_2$S Precursor by Evaporation in a Bent Tube Method.

The transport of 20 g Tl$_2$S only took 5 hours, indicating the evaporation in a bent tube method was highly efficient.

Table 5 shows the comparison of the impurity analyses of Tl$_2$S before and after purification via the evaporation method.

TABLE 5

Comparison of impurity analyses of $Tl_2S$ before and after purification
(↑: increase ↓: decrease →: almost no change)

| Impurities | Impurity concentration of 5N Tl | Impurity concentration of 5N S | Estimated impurity concentration before purification (ppm, wt) | Impurity concentration after purification (ppm, wt) | Tendency |
|---|---|---|---|---|---|
| Li | <0.01 | <0.05 | <0.01 | 0.27 | ↑ |
| Na | <0.01 | 0.5 | <0.04 | 4.3 | ↑ |
| Mg | 0.16 | 0.09 | 0.15 | 0.04 | ↓ |
| Al | 1.2 | 0.09 | 1.11 | <0.01 | ↓ |
| Si | <0.05 | 1.3 | <0.14 | 0.24 | ↑ |
| Ca | <0.01 | 3.5 | <0.26 | 0.04 | ↓ |
| Cu | 5.2 | <0.1 | 4.83 | 1.3 | ↓ |
| Ag | 7.3 | <0.1 | <6.77 | 0.56 | ↓ |
| Te | 19 | <0.5 | <17.6 | 6 | ↓ |
| Pb | 21 | <0.5 | <19.5 | 12 | ↓ |
| Bi Total | 7 | 0.2 | <6.50 | 1.6 | ↓ |

The evaporation method was found to be highly effective in eliminating Mg, Al, Ca, Cu, Ag, Te, Pb and Bi.

Purification of $Tl_2Se$ Precursor by Evaporation in a Bent Tube Method.

The transport of 20 g $Tl_2Se$ only took 5 hours, indicating the evaporation method in a bent tube was highly efficient. Compositional analysis by EDS reveals that the purified $Tl_2Se$ was stoichiometric. The results of impurity analysis showed that evaporation was quite effective in removing Na, Mg, Al, Cl, Ca, Fe, Ni, Ag, Pb and Bi, as shown in Table 6. The increase in Si concentration was likely caused by contaminants from the silica ampoule Table 6 shows the comparison of impurity concentrations before and after purification by the evaporation in a bent tube method.

TABLE 6

The comparison of impurity concentrations of $Tl_2Se$ before and after one-time evaporation in a bent tube.
(↑: increase ↓: decrease →: almost no change)

| Impurities | Impurity concentration before purification (ppm, wt) | Impurity concentration after purification (ppm, wt) | Tendency | Comments |
|---|---|---|---|---|
| Na | 0.015 | 0.01 | ↓ | Effective |
| Mg | 0.13 | <0.01 | ↓ | Effective |
| Al | 1.01 | <0.01 | ↓ | Effective |
| Si | 0.04 | 0.12 | ↑ | Contamination |
| Ca | 0.03 | <0.01 | ↓ | Effective |
| Fe | 0.09 | <0.01 | ↓ | Effective |
| Ni | 0.017 | 0.01 | ↓ | Effective |
| Ag | 0.63 | <0.05 | ↓ | Effective |
| Te | 15.9 | 5.6 | ↓ | Effective |
| Pb | 17.6 | 2.3 | ↓ | Effective |
| Bi | 5.83 | 0.8 | ↓ | Effective |

(↑: increase ↓: decrease →: almost no change)

Electronic Structure of Defects

Based on the impurity analysis, the main impurities in the precursors were identified as Si, Sn, Al, Pb and Bi. Additionally, Cl, Br, S and Te were observed in significant amounts. To understand the effect of these impurities on the electronic properties of $Tl_6SeI_4$, first-principles electronic structure calculations of defected of $Tl_6SeI_4$ were carried out using the supercell approach. The main goal was to determine the character of the defect electronic states introduced by the impurities and to identify those impurities that can introduce deep electronic levels in the bandgap of $Tl_6SeI_4$. $Tl_6SeI_4$ is a direct gap semiconductor with experimental band gap of 1.86 eV. The calculations with the Perdew-Burke Ernzerhof (PBE) functional yielded a direct band gap of 1.43 eV at Γ point. This calculated value was underestimated compared with the measured one. Underestimation of band gaps is a known issue of DFT calculations employing exchange-correlation functionals based on the local density approximation, such as PBE, and also makes it difficult to determine positions of deep defect levels in the band gap. To correct the positions of the defect levels due to band gap underestimation, an approach proposed in Alkauskas, A., et al., Defect Energy Levels in Density Functional Calculations: Alignment and Band Gap Problem. *Phys Rev Lett* 2008, 101 (4), 046405 was employed. The calculations for the primitive cell of $Tl_6SeI_4$ were first performed both with the PBE functionals and the hybrid functional of Heyd-Scuseria-Emzerhof (HSE). (See, Heyd, J., et al., Hybrid functionals based on a screened Coulomb potential. *The Journal of Chemical Physics* 2003, 118 (18), 8207-8215.) The HSE calculations allow correcting for the band gap underestimation, but the high computational cost makes them prohibitively expensive if applied directly to the defect calculations. Using the alignment of the HSE band-edge positions relative to those from the PBE calculation, the required relative shifts of the valence band maximum (VBM) and the conduction band minimum (CBM) were then determined. To correct for the defect levels position, shallow defect levels were shifted together with their respective band edges, whereas the localized deep levels were not shifted with the band edge corrections.

As the first step of the calculations, the preferred sites that the impurities will occupy after being introduced in the $Tl_6SeI_4$ crystal were determined based on the formation energies of the corresponding defect configurations. From the crystal structure of $Tl_6SeI_4$ there are four non-equivalent lattice sites in the structure (1 Se, 1 I, and 2 Tl) which can be substituted by the impurity atoms, as well as the interstitial site. The formation energies of intrinsic and extrinsic defects depend on the crystal growth conditions, which dictate the possible values of chemical potentials of the constituents (Tl, Se, I). Changes in growth conditions may affect the preference site of impurities. The formation energies of charge neutral defects can be calculated as follows:

$$\Delta H_D = (E_D - E_{Host}) + \sum_i n_i(\mu_i^0 + \Delta\mu_i)$$

where $E_D$ and $E_{Host}$ are the total energies of the defect-containing and the defect-free host supercells, $n_i$ is the number of atoms of species i participating in the exchange, $\mu_i^0$ is the bulk chemical potential and $\Delta\mu_i$ is the relative chemical potential of the ith atomic species participating in the atom exchange. The available range of relative chemical potentials of the constituents $\Delta\mu_i$ (i=Tl, Se, I) were determined from the thermodynamic stability phase diagram of $Tl_6SeI_4$ presented in [Ref]. For the impurities, $\Delta\mu_i$ was taken as 0 ($\Delta\mu_i$ terms will cancel out in determination of site preference energy). The relative chemical potentials for the two extreme growth conditions are as follows: Tl-poor/Se-rich–$\Delta\mu_{Tl}$=−0.67 eV, $\Delta\mu_{Se}$=0, $\Delta\mu_I$=−0.66 eV, and Tl-rich/Se-poor–$\Delta\mu_{Tl}$=0, $\Delta\mu_{Se}$=−1.34 eV, $\Delta\mu_I$=−1.32 eV.

The calculated formation energies of impurities occupying different lattice sites are presented in Table 7. The formation energies for each impurity are given relative to the most stable defect, for which the formation energy is assigned to zero and is shown in bold. It can be seen from Table 7 that in Tl-poor/Se-rich growth conditions Al, Sn, Pb and Si impurities favor Tl1 sites and strongly dislike occupying S and I sites and the interstitial site. For Sn and Pb impurities the preference for a Tl1 site over a Tl2 is very small, but it is larger for Al. The situation is different for the Bi impurity, which prefers to occupy a Tl2 site over a Tl1. Among metallic impurities these preferences directly correlate with the covalent radii of the impurities: the covalent radii increase in the sequence Al<Sn<Pb<Bi, and so does the preference to occupy site Tl2 over site Tl1. Though sites Tl1 and Tl2 have the same character of chemical bonding and the same nearest neighbors (1 Se, 4 I), the distances to the neighbors are smaller for Tl1 (Tl—Se: 2.955 Å, Tl—I: 3.477 Å) than for Tl2 (Tl—Se: 3.078 Å, Tl—I: 3.484 Å and 3.494 Å). Thus, it is energetically favorable for larger impurity atoms to replace Tl2 and for smaller atoms to replace Tl1 to minimize the energy cost associated with lattice relaxation around the impurity.

good qualitative illustration of the defect transition levels and allow understanding of their character and physical origins.

Sn and Pb are electronic analogues, and their impurities in $Tl_6SeI_4$ exhibit similar behavior. Sn and Pb p states interact with the electronic states of $Tl_6SeI_4$ at and near CBM resulting in resonance states that push CBM –0.03 eV below its original position. Hence, Sn and Pb can be characterized as very shallow donors in $Tl_6SeI_4$. FIG. 4B illustrates the changes to the $Tl_6SeI_4$ band structure due to $Pb_{Tl1}$ impurity in the 1+ charge state.

Figures 4C, 4D:
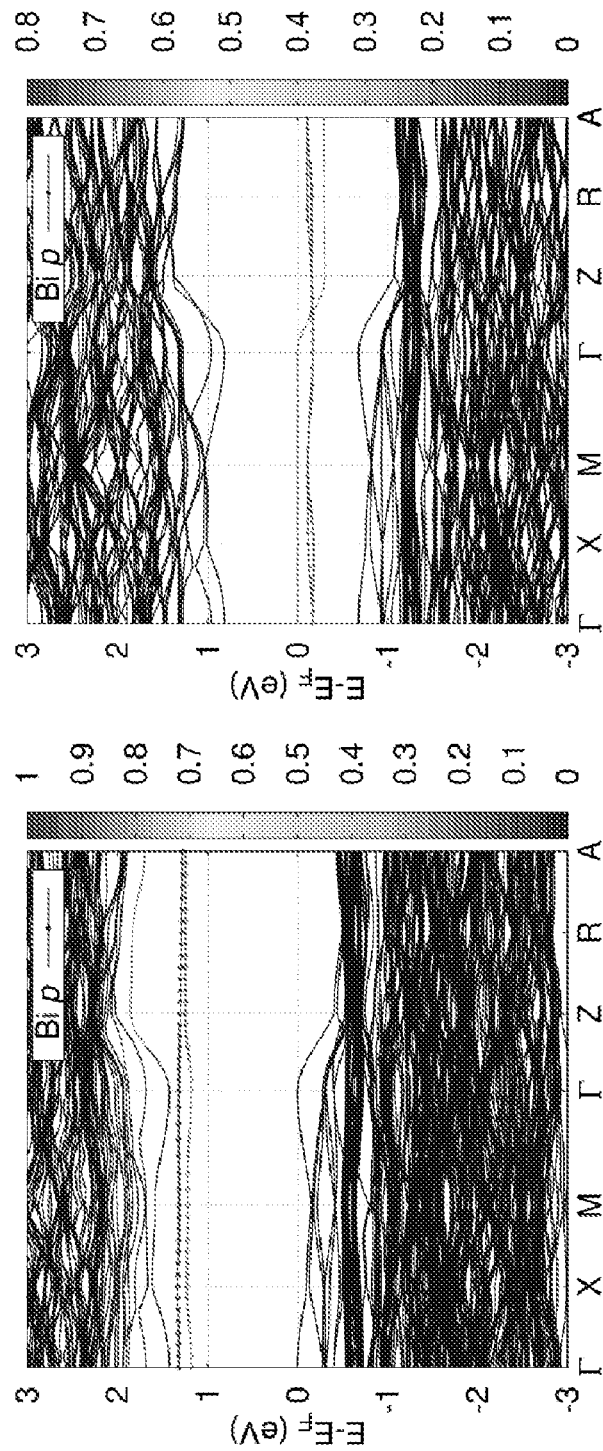
FIG. 4C depicts the electronic band structure of $Tl_6SeI_4$ 176-atom supercells containing defect $Bi_{Tl2}^{1+}$.
FIG. 4D depicts the electronic band structure of $Tl_6SeI_4$ 176-atom supercells containing defect $Bi_{Se}^{1-}$.

Bi impurity occupies the Tl2 site in Tl-poor/Se-rich growth conditions, and is a deep donor which introduces two defect levels at –0.47 eV and –0.26 eV relative to the CBM (FIG. 4C). The electronic levels created by $Bi_{Tl2}$ have a character of Bi p states and are capable of capturing of up to two electrons. In Tl-rich/Se-poor growth conditions, the Bi impurity prefers to occupy an Se site, and acts as a deep acceptor: it introduces two Bi p defect levels very deep into the band gap at +0.84 eV and +0.92 eV, relative to the VBM. The calculated band structure of $Tl_6SeI_4$ with one Bi atom in the 1– charge state substituting Se atom is shown in FIG. 4D. Being located near the center of the band gap, these $Bi_{Se}$

TABLE 7

Relative formation energies (eV) of impurities occupying different lattice sites in $Tl_6SeI_4$ calculated for two growth conditions

| | Tl-poor/Se-rich | | | | | Tl-rich/Se-poor | | | | |
|---|---|---|---|---|---|---|---|---|---|---|
| Impurities | Tl1 | Tl2 | Se | I | Interstitial | Tl1 | Tl2 | Se | I | Interstitial |
| Al | 0 | 0.13 | 3.63 | 2.70 | 2.04 | 0 | 0.13 | 1.62 | 1.37 | 1.37 |
| Sn | 0 | 0.03 | 1.90 | 2.60 | 1.05 | 0 | 0.03 | 0.59 | 0.57 | 0.38 |
| Pb | 0 | 0.01 | 2.91 | 2.08 | 1.24 | 0 | 0.01 | 0.90 | 0.75 | 0.57 |
| Bi | 0.13 | 0 | 0.94 | 0.55 | 0.63 | 1.19 | 1.07 | 0 | 0.29 | 1.03 |
| Si | 0 | 0.06 | 2.18 | 2.08 | 0.62 | 0.05 | 0.11 | 0.22 | 0.79 | 0 |

In Tl-rich/Se-poor growth conditions Al, Sn, and Pb impurities continue to occupy Tl1 sites, however Bi and Si impurities change their preference site: Bi occupies the Se site, while the Si impurity now prefers to occupy the interstitial position in the lattice.

Using the calculated formation energies of the neutral and charged defects, the charge transition levels can be determined. The energy position of these levels with respect to the band edges describes the character of the defect (donor or acceptor, shallow or deep), and for strongly localized deep levels corresponds to the actual position of such a level with the band gap. According to the calculations, Al impurity is a deep donor with the charge transition levels located at –0.70 eV below the CBM with the charge transition state of 2+/0. The calculated band 176-atom supercell of $Tl_6SeI_4$ with one Al atom in the 1+ charge state substituting Tl1 atom is shown in FIG. 4A. It can be seen that the Al impurity produces a deep electronic level within the gap which is mostly comprised of non-interacting Al s states and is capable of electron trapping.

It should be noted that the positions of the defect levels obtained in band structure calculations (one-electron Kohn-Sham levels) are not equal to the energy positions of the charge transition levels because one-electron levels are calculated for the system in the fixed charge state, whereas charge transition levels represent the Fermi energy at which two different charge states are at equilibrium. Also, no band gap corrections to the position of the one-electron levels are applied. Nevertheless, calculated band structures provide a defect levels are capable of trapping and recombining both holes and electrons, and therefore are particularly detrimental to the detector properties of $Tl_6SeI_4$.

Figures 4E, 4F:
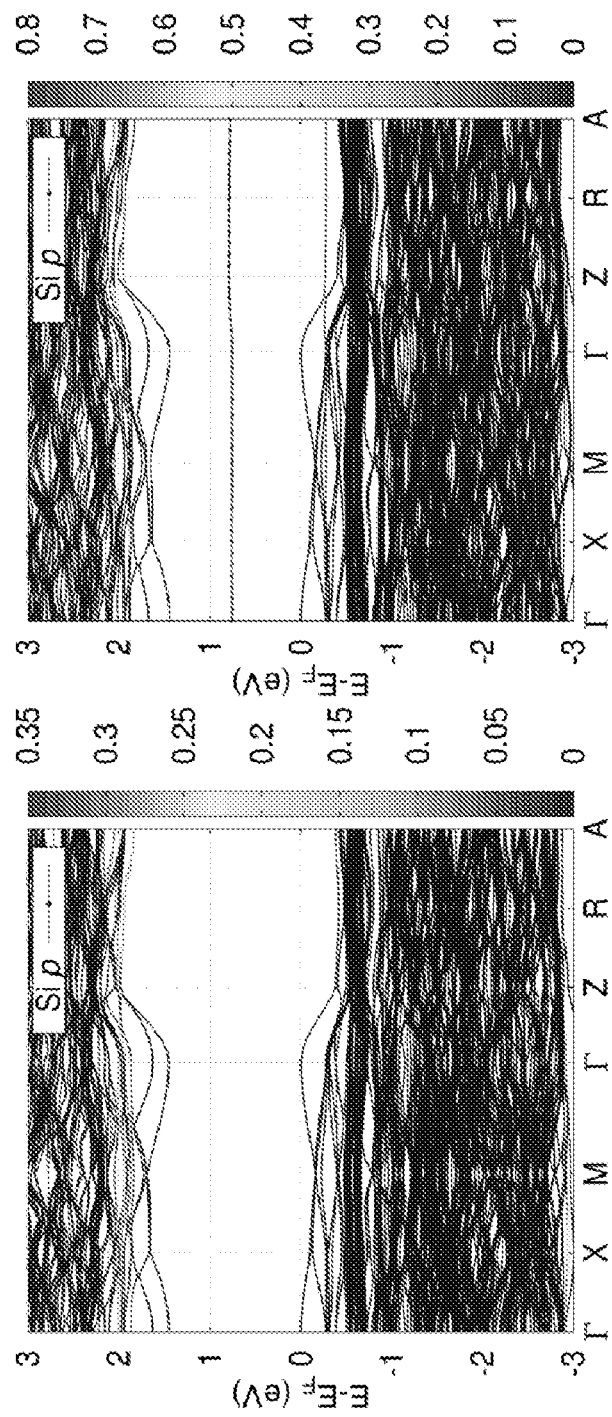
FIG. 4E depicts the electronic band structure of $Tl_6SeI_4$ 176-atom supercells containing defect $Si_{Tl1}^{1+}$.
FIG. 4F depicts the electronic band structure of $Tl_6SeI_4$ 176-atom supercells containing defect $Si_{int}^{1+}$. Colors of bands represent contributions from electronic states shown in inserts.

The Si impurity can occupy two different sites depending on growth conditions. In Tl-poor/Se-rich growth conditions, Si occupies the Tl1 site. From the band structure of $Tl_6SeI_4$ with the Si atom in the 1+ charge state substituting for the Tl1 atom presented in FIG. 4E, it can be seen that the Si p states interact with the bulk electronic states of $Tl_6SeI_4$ at approximately 0.5 eV above CBM. $Si_{Tl1}$ does not introduce in-gap or near-gap states and does not affect band gap width. Therefore, Si impurities occupying Tl1 positions are electronically inactive and not harmful to the detector properties of $Tl_6SeI_4$. However, in Tl-rich/Se-poor growth conditions Si prefers to occupy an interstitial site in $Tl_6SeI_4$, and its electronic behavior is completely different: $Si_{int}$ is a deep donor defect which introduces a charge transition level located 0.65 eV below the CBM. FIG. 4F shows the formation of the defect level caused by an Si interstitial; the main characteristic of this level is Si p states.

Cl and Br impurities are chemical, and electronic analogues of I, and S and Te impurities are electronic analogues of Se. The calculation of defect formation energies showed that, independent of the crystal growth conditions, Cl, Br, S and Te impurities prefer to occupy exclusively the lattice sites of their corresponding chemical analogues, where they participate in chemical bonding in place of the original atoms. $Cl_I$, $Br_I$, $S_{Se}$ and $Te_{Se}$ defects do not introduce defect transition levels in the band gap and do not change band gap width, and therefore are electrically inactive.

The results of the calculations are summarized in Table 8. Among all the impurities considered, Al and Bi introduce deep trapping levels in the band gap in all growth conditions. These trapping levels can act as recombination centers, impeding carrier collection and having a detrimental effect on carrier transport. Therefore, particular attention should be paid to eliminating these impurities. Si impurity also introduces deep electron trapping levels, but only in Tl-rich/Se-poor growth conditions; hence, its adverse effect can be mitigated by performing synthesis in Tl-poor/Se-rich conditions. In these conditions Si impurities will change their occupation position to $Si_{Tl1}$ and become electrically benign, their detrimental effect will be eliminated, and deep removal of Si may not be necessary. Note that the preference for Si to occupy the interstitial site is small (0.05 eV, see Table 7) even in extreme Tl-rich/Se-poor conditions, so even a small deviation to more Tl-poor/Se-rich growth conditions will be sufficient to change the occupation position of Si and make it electrically inactive. Shallow donors Sn and Pb are not as harmful to the charge carrier collection performance of $Tl_6SeI_4$. Rather, they are n-type dopants that can decrease resistivity and increase dark current in $Tl_6SeI_4$-based detector devices, so the reduction of their concentration should have a beneficial effect. Cl, Br, S and Te impurities are electrically inactive and generally harmless. However, in high concentrations they can lead to lattice distortion, band broadening and an increase in hole effective masses, resulting in the reduction of carrier mobility. Therefore, lowering the concentration of Cl, Br, S and Te impurities is still advised, but is not as critical to the performance of $Tl_6SeI_4$-based detector devices.

TABLE 8

Occupied lattice sites and character of impurity-related defects in $Tl_6SeI_4$ in two growth conditions.

| Impurities | Tl-poor/Se-rich | | Tl-rich/Se-poor | |
|---|---|---|---|---|
| | Occupied site | Defect character | | |
| Al | Tl1 | Deep donor | Tl1 | Deep donor |
| Sn | Tl1 | Shallow donor | Tl1 | Shallow donor |
| Pb | Tl1 | Shallow donor | Tl1 | Shallow donor |
| Bi | Tl2 | Deep donor | Se | Deep acceptor |
| Si | Tl1 | Inactive | Interstitial | Deep donor |
| Cl | I | Inactive | I | Inactive |
| Br | I | Inactive | I | Inactive |
| S | Se | Inactive | Se | Inactive |
| Te | Se | Inactive | Se | Inactive |

Charge Transport.

Figure 5A:
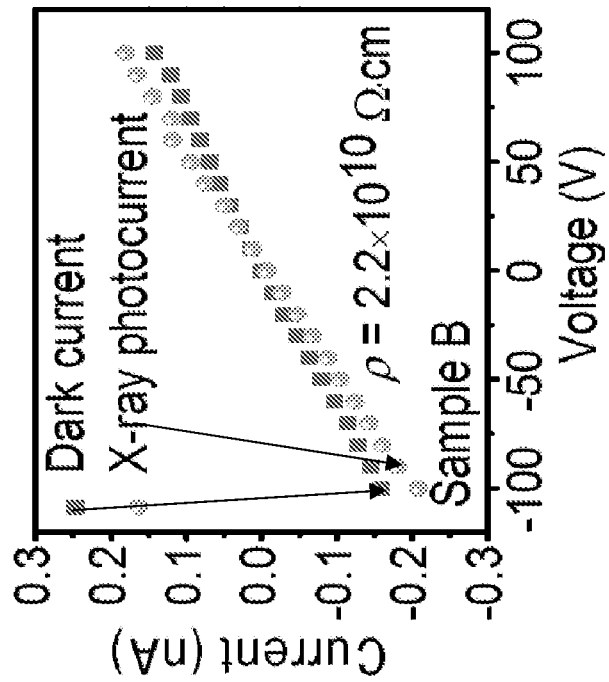
FIG. 5A shows the I-V characteristic of sample A $Tl_6SeI_4$ detector grown with purified raw materials.
Figure 5B:
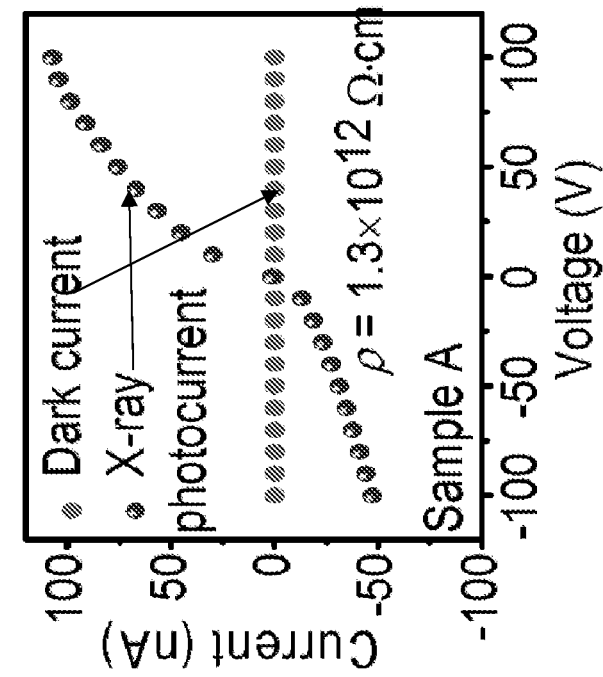
FIG. 5B depicts the I-V characteristic of sample B detector grown with unpurified raw materials.

FIG. 5A shows the I-V characteristics of the $Tl_6SeI_4$ sample A detector (grown with purified raw materials) in the dark and under irradiation from 22 keV Ag X-rays. Sample A shows a linear I-V characteristic in the voltage range of −100 V to 100 V with a resistivity on the order of $10^{12}$ Ω·cm, well above the basic requirement of $10^8$ Ω·cm for hard radiation detection. The photocurrent generated by incident X-rays is on the order of $10^2$ nA at 100 V (107 nA), which is three orders of magnitude higher than the dark current at 100 V (0.118 nA). Such a high ratio of photocurrent to dark current demonstrates that sample A is photoresponsive to X-rays. In contrast, sample B (grown without non-purified raw materials) has a lower resistivity of $2.2 \times 10^{10}$ Ω·cm. In addition, sample B does not show a photoresponse generated by incident X-rays. The significant increase in photosensitivity demonstrates that purification is highly effective in improving $Tl_6SeI_4$ crystal quality.

Detector Performance and Mobility Estimation.

Figure 6B:
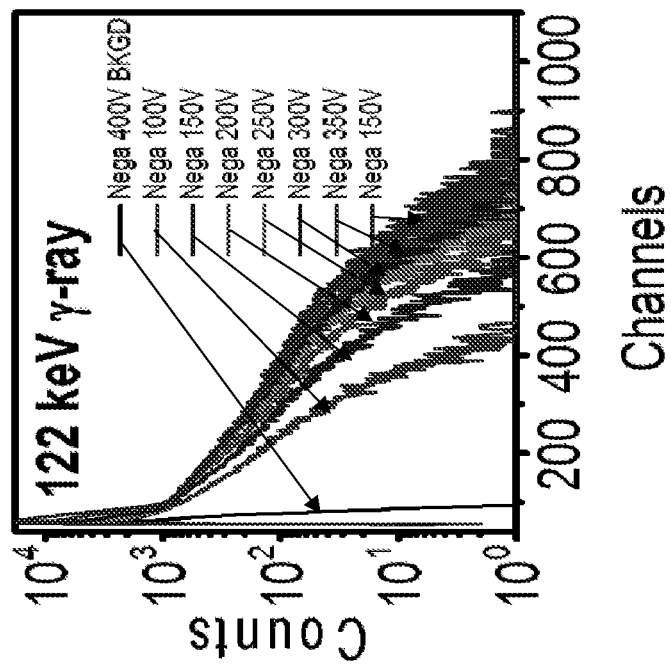
FIG. 6B depicts pulse height spectra to 122 keV $^{57}$Co γ-rays obtained from sample A as a function of bias voltage under anode irradiation configuration.
Figure 6A:
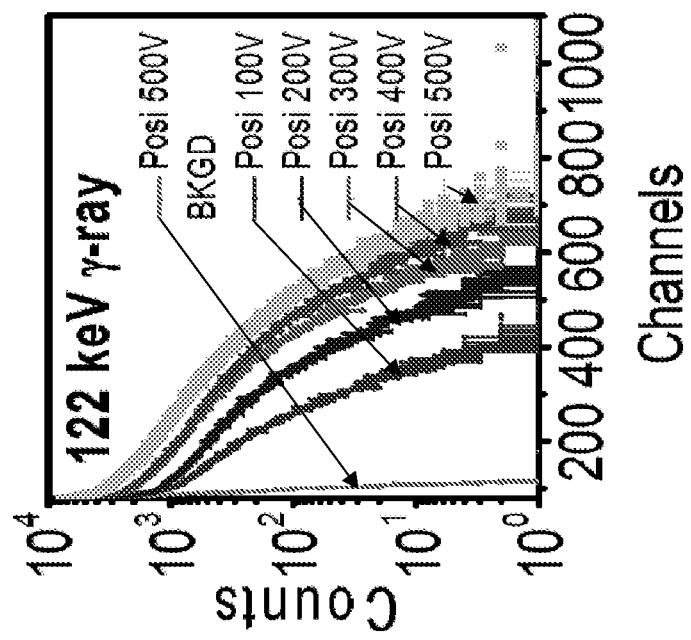
FIG. 6A shows pulse height spectra obtained from sample A in response to 122 keV $^{57}$Co γ-rays as a function of various bias voltages under cathode irradiation configuration.

FIGS. 6A and 6B show pulse height spectra obtained from sample A with 122 keV γ-rays under both cathode and anode irradiation configurations, respectively. Sample A shows reasonable γ-ray response, and a bump in the energy spectral response curve is able to be clearly distinguished over the background. The shoulder in the spectra shifts toward higher channels with increasing applied bias voltage. However, no spectroscopic resolution of a photopeak could be obtained at this stage. In contrast, sample B grown without purification does not show any photoresponse upon 122 keV γ-rays from $^{57}Co$, as shown in FIG. 6C, since the signal is indistinguishable from the noise. The dramatic improvement in detection performance suggests that purification is a crucial step to improve crystal quality and a prerequisite for obtaining detection response.

Figure 7B:
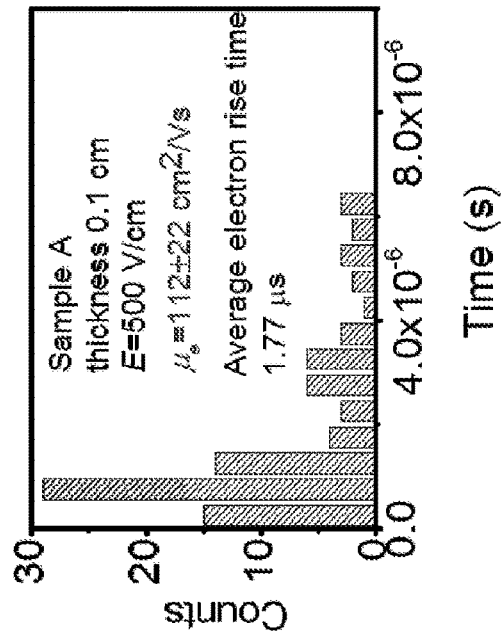
FIG. 7B shows statistics of electron rise times for the sample A $Tl_6SeI_4$ detector.
Figure 7D:
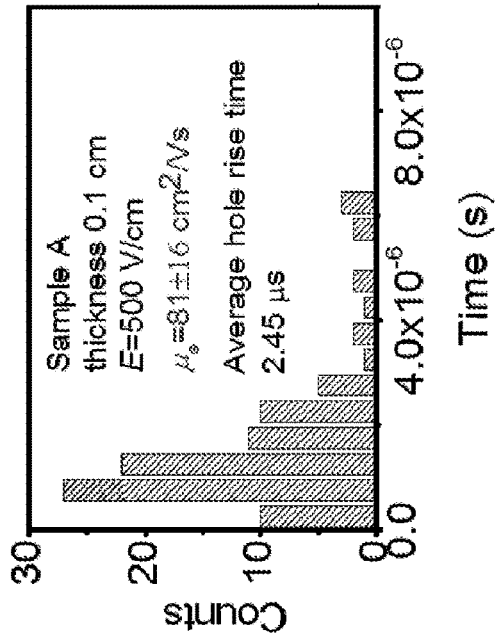
FIG. 7D shows statistics of hole rise times for a $Tl_6SeI_4$ detector made from sample A.
Figure 7A:
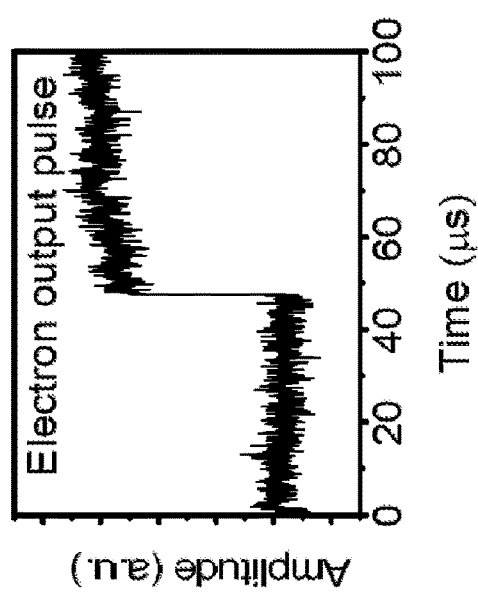
FIG. 7A shows a typical electron output pulse from preamplifier for the sample A $Tl_6SeI_4$ detector.
Figure 7C:
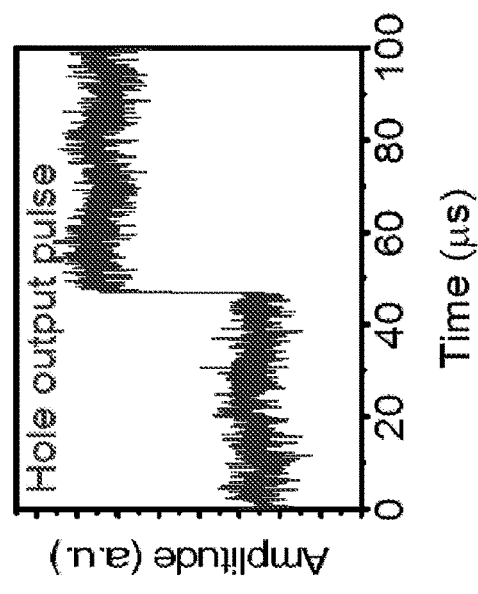
FIG. 7C depicts one typical hole output pulse from preamplifier for the sample A $Tl_6SeI_4$ detector.

The carrier mobility of $Tl_6SeI_4$ was experimentally determined using a time-of-flight analysis of the pulse induced by 5.5 MeV α-particles from a $^{241}Am$ source. FIG. 7A illustrates a typical electron output pulse of the sample A $Tl_6SeI_4$ detector under α-particle irradiation from $^{241}Am$. As shown in FIG. 7B, an average value of electron rise time of ~1.77 is was measured at an applied electric field of 500 V/cm from a detector with a thickness of 0.1 cm. Since the attenuation length (~20 μm) of alpha particles is much smaller than the detector thickness, the electron drifting time essentially equals the electron rising time. Using these values with the mobility equation, the electron mobility of the detector is estimated to be $112 \pm 22$ $cm^2 \cdot V^{-1} \cdot s^{-1}$. Similarly, the hole mobility is estimated to be $81 \pm 22$ $cm^2 \cdot V^{-1} \cdot s^{-1}$. The high carrier mobilities demonstrate the usefulness of $Tl_6SeI_4$ as a detector material.

Example 2

In this example, one facile method was developed to chemically reduce Tl oxides, and then eliminate oxygen impurity by adding high-purity graphite powder during the synthesis of Tl containing ternary compounds for radiation detection. The reactivity between Tl oxidation and carbon was also investigated and confirmed. This technology was applied to one of the Tl based ternary compounds, $Tl_6SeI_4$. A high-quality and high-resistivity $Tl_6SeI_4$ crystal was grown using polycrystalline $Tl_6SeI_4$ synthesized by adding graphite powder. The resulting high-quality and centimeter-sized $Tl_6SeI_4$ single crystal was grown by the vertical Bridgman method using purified $Tl_6SeI_4$ raw materials. The improved crystallinity of the $Tl_6SeI_4$ crystal after purification was confirmed by photoluminescence measurements. The effectiveness and efficiency of this purification method was evaluated by assessing the resistivities and detection performance for γ-rays of $Tl_6SeI_4$ detectors before and after purification. The reactivity between Tl oxide and carbon was further investigated and confirmed, and a possible reaction route was proposed. Theoretical calculations suggested that the O impurity would be able to act as a deep level defect if the O impurity were to occupy the interstitial site, which is detrimental to the charge transport and detection performance. These calculation results in turn revealed the significance of eliminating the oxygen impurity. Further calculation on C related defects revealed the C atom is not likely to be incorporated into the lattice due to high formation energies.

Experimental Section

Synthesis.

The polycrystalline $Tl_6SeI_4$ was synthesized by the direct chemical combination of Tl metal (99.999%, Alfa Aesar), TlI beads (99.999%, Alfa Aesar) and Se shot (99.999%, Alfa Aesar) with the appropriate stoichiometry. Due to the sensitivity to air of the Tl metal, the commercially bought Tl metal included a grey oxidation layer. This oxidation layer was mainly comprised of $Tl_2O_3$. In order to remove the surface oxidation, one metallic blade was used to remove the oxidation layer until the whole ingot became shiny. The removal of the oxidation layer was performed in an inert glovebox filled with high-purity $N_2$ gas. The TlI precursor was preheated for 24 hours at 120° C. under vacuum in a silica ampoule to remove moisture absorbed onto the surface of TlI. Five mg fine carbon powder with a purity of 99.999% (weight ratio of 0.1%; Alfa Aesar, 200 mesh) was added into the three starting precursors before the synthesis. A conical-tipped, carbon-content silica tube with an inner diameter of 10 mm and an outside diameter of 14 mm was used as an ampoule for loading all the precursors. The tube was sealed under a residual pressure of $1\times10^{-4}$ mbar. The synthesis was performed at 550° C. for 24 hours in a rocking furnace to ensure complete reaction of precursors. After synthesis, the $Tl_6SeI_4$ polycrystals were obtained after breaking the tube in the inner glove box filled by $N_2$ gas. The tail and tip sections of the ingot were discarded, while the middle section was extracted as the raw material for crystal growth. As a reference, another polycrystalline $Tl_6SI_4$ ingot was synthesized under the same experimental conditions without adding fine carbon powder.

Crystal Growth.

The as-synthesized $Tl_6SeI_4$ raw material was put into a tapered and carbon coated silica tube with one ID of 10 mm and 14 mm, and the tube was sealed under a $1\times10^{-4}$ mbar pressure. The raw material was pre-melted in a vertical two-zone Bridgman furnace prior to crystal growth. The Bridgman furnace was equipped with a motor-controlled platform. Crystal growth proceeded with a translation rate of 0.5 mm/h in a temperature gradient of 30° C./cm. The temperature of the hot zone was set as 600° C. to ensure complete melting of the compound, while the cold zone was set as 200° C. to allow for in situ annealing to improve crystallinity and reduce thermal stress. The reference polycrystalline $Tl_6SI_4$ raw material was also grown under the same growth conditions.

Crystal Processing and Characterization.

Samples were cut using a Struers Accutom-50 wafterizing saw with a 300 μm wide diamond-impregnated blade and polished with silicon carbide sand paper and alumina slurries with a particle size of 0.05-1 μm. Since fine carbon powder was added during synthesis, the existence of carbon inclusion was checked by using a Hitachi SU-8030 scanning electron microscope (SEM) equipped with a backscattered electron (BSE) detector operating with an accelerating voltage of 30 KV and a current of 10 mA.

Photoluminescence (PL) Measurements.

The $Tl_6SeI_4$ single crystalline samples grown with and without adding fine graphite powder were mounted on a vertical stage using a small amount of Cry-Con grease (Air Products and Chemicals) and cooled to cryogenic temperatures (~15 K) using a closed-cycle He cryostat (SHI cryogenics DE-202). A 405-nm, continuous-wave (CW) semiconductor laser (either Excelsior One-405 from Spectra-Physics or OBIS laser from Coherent, Inc.) was used as the excitation source for photoluminescence (PL) measurements. The laser beam diameter for the OBIS laser was ~0.8 mm, and its intensity was controlled by a computer; whereas the beam diameter for the Excelsior laser was ~1.2 mm, and its intensity was controlled by a series of neutral density filters. The laser beam was passed through a 405-nm bandpass filter (FHWM of 10 nm, Thorlabs, Inc.) before hitting the sample surface. Subsequently, either a 405 nm notch or 650 nm low pass filter was used to filter the scattered and reflected laser light before the entrance slit to the monochromator. The photoluminescence (PL) spectrum was resolved by a 0.75 μm SPEX grating monochromator equipped with a Hamamatsu photomultiplier tube (R928 PMT). Slit widths for entrance and exit slits in the monochromator were 200 μm. An optical chopper at a frequency of ~710 Hz and a lock-in amplifier were used with signal averaging. Finally, the PL spectrum was collected at a rate of 0.5 nm·s$^{-1}$.

Charge Transport Characterization.

Direct Current (DC) conductivity was measured using a Keithley 6517B electrometer and a Keithley 6105 resistivity adapter with stainless steel electrodes. Electromagnetic interference and photoconductive responses were eliminated by the metallic enclosure. The electrodes were made by applying fast-dry Ag or carbon paint purchased from TED Pella. The diameter of the cathode on the top of the sample was around 2 mm, while the area of the anode on the bottom of the sample was the same as that of the bottom face of the sample. One mil Cu wires were attached to the contacts made by Ag or carbon paint, and then attached to Cu foils. The sample was mounted on a 1-square-inch glass substrate. The thickness of the device was 1.0 mm.

γ-Ray Performance Characterization.

Detector performance was probed using a 0.3 mCi $^{57}$Co source generating 122 KeV γ-ray. The fabricated device was connected to an eV-550 preamplifier box. Various bias voltages from 100 to 500 V were applied. The signals were transferred to an ORTEC amplifier (Model 572 Å) with a gain of 200, shaping time of 0.5 μs, and collection time of 180 s before they were evaluated by a dual 16 K input multichannel analyzer (Model ASPEC-927) and read into the MAESTRO-32 software.

Phase Composition Determination and Thermal Analysis.

Powder X-ray diffraction (PXRD) for verification of phase purity of Tl oxidations was performed on an Si-calibrated Inel CPS 120 diffractometer with a position-sensitive detector and graphite-monochromated Cu Kα radiation operating at 40 KV and 20 mA. The PXRD patterns were recorded using the Windif data acquisition program. To assess the thermal stability of Tl oxide, thermogravimetric analysis (TGA) was performed using a Shimadzu DTA-50 thermogravimetric analyzer. Ground crystalline material (~90 mg, 99.5% purity, Alfa Aesar) was put in an Al crucible. Samples were heated to 400° C. at 4° C./min under $N_2$ gas flow.

Electronic Band Structure Calculations.

First-principles total energy calculations within the density functional theory framework were employed to investigate the defect electronic structure of $Tl_6SeI_4$. The Projector Augmented Wave method implemented in the Vienna Ab-initio Simulation Package was employed. (See, Blochl, P. E., Projector Augmented-Wave Method. *Phys Rev B* 1994, 50 (24), 17953-17979; Kresse, G., et al., Efficient iterative schemes for ab initio total-energy calculations using a plane-wave basis set. *Phys Rev B* 1996, 54 (16), 11169-11186; and Kresse, G., et al., Ab-Initio Molecular-Dynamics Simulation of the Liquid-Metal Amorphous-Semiconductor Transition in Germanium. *Phys Rev B* 1994, 49 (20), 14251-14269.) The energy cut off for the plane wave basis was set to 350 eV. The exchange-correlation contribution to the potential was included using the generalized gradient approximation (GGA) within the Perdew-Burke-Ernzerhof (PBE) functional. (See, Perdew, J. P., et al., Generalized Gradient Approximation Made Simple. *Physical Review Letters* 1996, 77 (18), 3865-3868.) To describe the isolated defects and impurities, 2×2×2 supercells containing 176 atoms and a 3×3×3 k-point mesh were utilized. The internal atomic positions of the defect structures were fully relaxed until the residual forces on atoms were less than 0.01 eV/Å, while the lattice parameters of the supercells remained fixed.

Results and Discussion

Crystal Growth.

The purchased Tl metal is typically covered by a dark grey oxidation crust because of air exposure. To confirm that this layer consists of thallium oxide, PXRD was used measurement to determine the phase of the oxidation layer. First, the Tl metal was intentionally exposed to air until the oxidation layer became thicker. Subsequently, the black crust was scraped off using a blade and ground into powder for PXRD measurements. The obtained PXRD pattern matched well the calculated PXRD pattern of $Tl_2O_3$, indicating that the crust in the Tl metal was pure $Tl_2O_3$ phase. No other phase was detectable in the experimental pattern. The existence of $Tl_2O_3$ on the surface of the Tl precursor could have acted as nucleation sites, leading to crystallization as polycrystals. Moreover, the O impurity from $Tl_2O_3$ could have been incorporated into the crystal structure as interstitials or replacing Se atoms. These O-related defects could behave as deep levels trapping photoinduced electron-hole pairs (more details on the role of O related defects on calculation section). Hence, it was proposed that the removal of oxygen impurity from $Tl_2O_3$ could be chemically reduced by reaction with carbon powder, and then can be liberated as CO or $CO_2$ gas, filling the empty space above the flux in the ampoule. Based on this idea, the ternary raw materials were synthesized by adding fine graphite powder with stoichiometric Tl, Se and TlI precursors. After synthesis, the polycrystalline raw material was subject to crystal growth by the typical Bridgman method. The coated carbon layer was completely consumed after synthesis. There was readily noticeable residual pressure when opening the ampoule after synthesis, indicating gas was generated during synthesis. A black substance was found on the tail section of ingot A, confirmed by energy-dispersive X-ray spectroscopy (EDS) compositional analysis. Due to the thermal stress during cooling, shiny and smooth cross sections could be observed after cracking. The whole ingot could slide out from the ampoule, and no sticking spot was found between the ingot and the inner wall of the silica ampoule. Due to the significant difference between the densities of the carbon and the $Tl_6SeI_4$, the unreacted carbon floated on the top of the ingot. Fine carbon powder might have introduced carbon inclusions in the crystal. In order to check whether carbon inclusion existed in the crystal, SEM observation of the crystals was performed. One crystalline piece was extracted from the tail section of the ingot, and then adopted for SEM observation and compositional analysis by EDS. No carbon inclusion was observed in the crystal.

Photoluminescence Measurements.

Figure 8A:
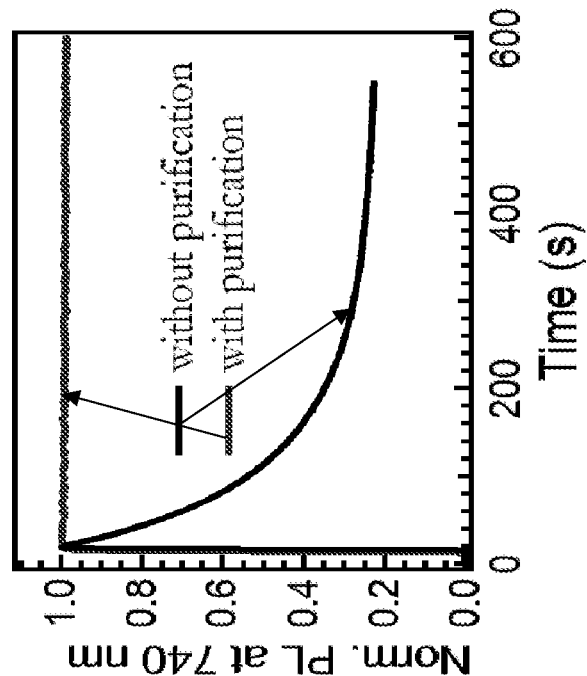
FIG. 8A shows PL spectra from $Tl_6SeI_4$ single crystals grown without and with adding fine carbon powder, at a laser intensity of 1 mW using a 405 nm semiconductor laser at 16 K; dotted lines indicate Gaussian peaks used to fit the spectra.
Figure 8B:
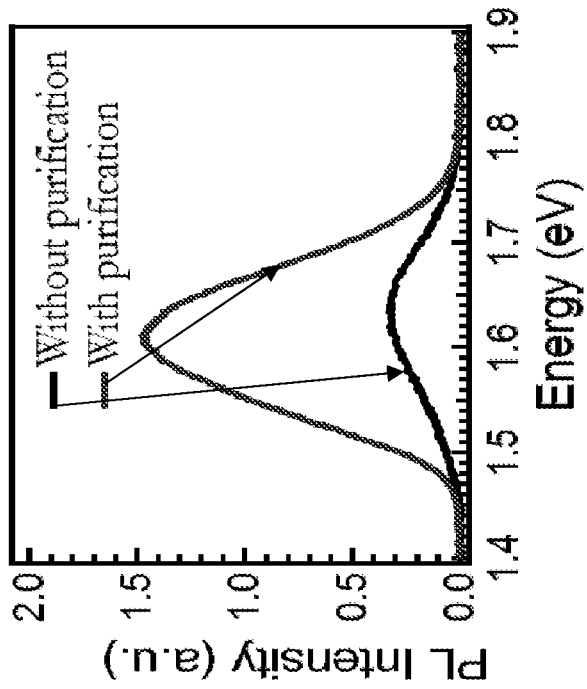
FIG. 8B depicts PL fatigue behavior from the corresponding crystals measured at a wavelength of 740 nm using a laser power of 50 and 30 mW, respectively.

FIG. 8A shows the PL spectra from $Tl_6SeI_4$ single crystals grown with (sample A; replotted from Ref.) (See, Kostina, S. S., et al., Photoluminescence fatigue and inhomogeneous line broadening in semi-insulating $Tl_6SeI_4$ single crystals. *Semiconductor Science and Technology* 2016, 31 (6), 065009) and without (sample B) using fine carbon powder. The spectrum from sample A was fitted with a strong emission peak at 1.61 eV and an overlapping weaker peak at 1.55 eV. Similarly, the PL spectrum from sample B was fitted with a dominant emission peak located at 1.64 eV and a weaker, overlapping peak at 1.53 eV. As shown in FIG. 8A, sample A exhibited almost five times higher emission intensity compared to that from sample B. Full-width at half-maximum (FWHM) of the dominant PL peak gave a measurement of the crystal quality—a higher emission intensity with a narrower FWHM indicates fewer defects. The estimated FWHM value for the dominant peak was 146 meV for sample B, whereas sample A showed a narrower FWHM of 137 meV, indicating an improvement in crystal quality after using fine carbon powder during crystal growth. Another noticeable feature of sample B was the significant reduction with time in its PL emission intensity under steady-state laser excitation, as shown in FIG. 8B. This behavior, also called PL fatigue, is undesirable because these defects cause additional radiative and nonradiative recombination pathways decreasing the PL emission intensity. They also distort the local lattice of the materials. In comparison, sample A did not show any sign of PL fatigue even after continuous laser excitation for ~10 min, which again demonstrates improvement in the crystal quality.

Charge Transport Property

Figure 10:
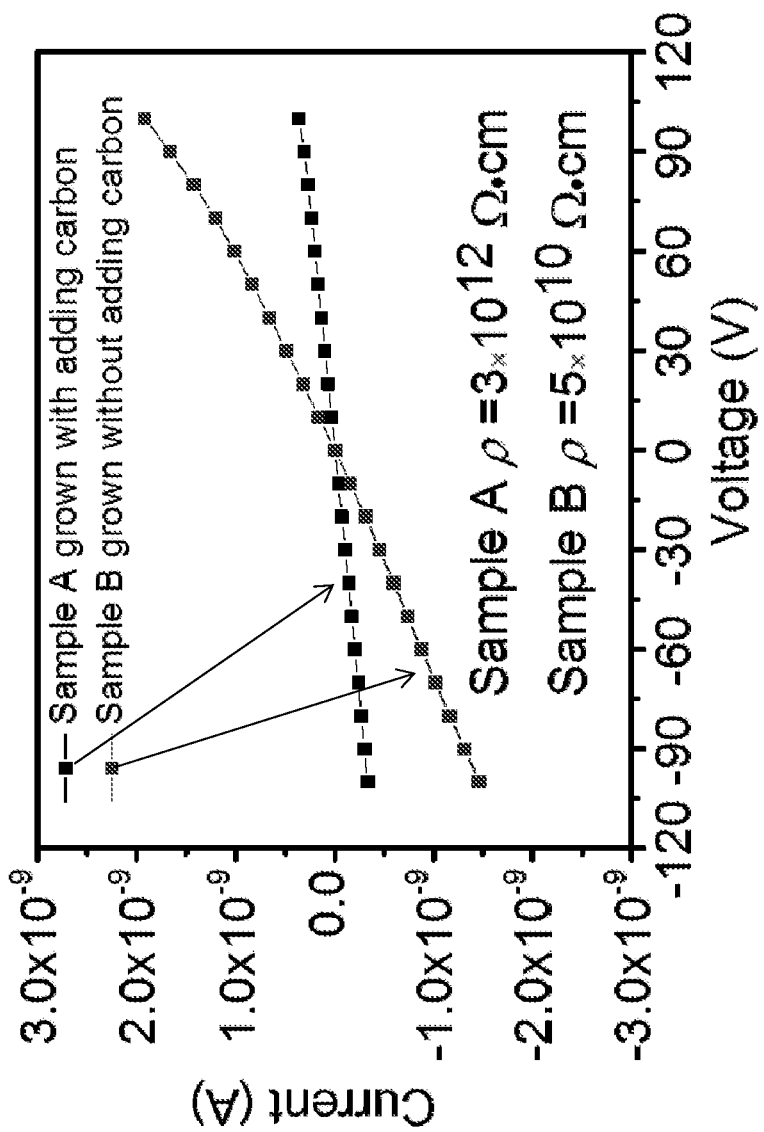
FIG. 10 shows the current-voltage (I-V) measurements for $Tl_6SeI_4$ samples A and B in Example 2.

The sample grown with adding carbon powder was labeled as sample A, while the sample grown without adding carbon powder was labeled as sample B. The current-voltage (I-V) measurements for $Tl_6SeI_4$ samples are shown in FIG. 10. Each sample was under bias for 200 seconds prior to recording the dark leakage current through the device at each bias. The leakage current was recorded as the applied bias increased from −100 V to 100 V with a 10 V increment. Both of the two samples showed liner I-V characteristic in the voltage range from −100 V to 100 V. The bulk resistivity of sample B was around $5\times10^{10}$ Ω·cm, while the bulk resistivity of sample A was around $3\times10^{12}$ Ω·cm. Sample A's resistivity was almost two orders of magnitude higher than that of sample B. The improvement of resistivity demonstrates the effectiveness of this technology, since high resistivity is one benchmark of crystallinity.

Detector Performance.

Figure 11:
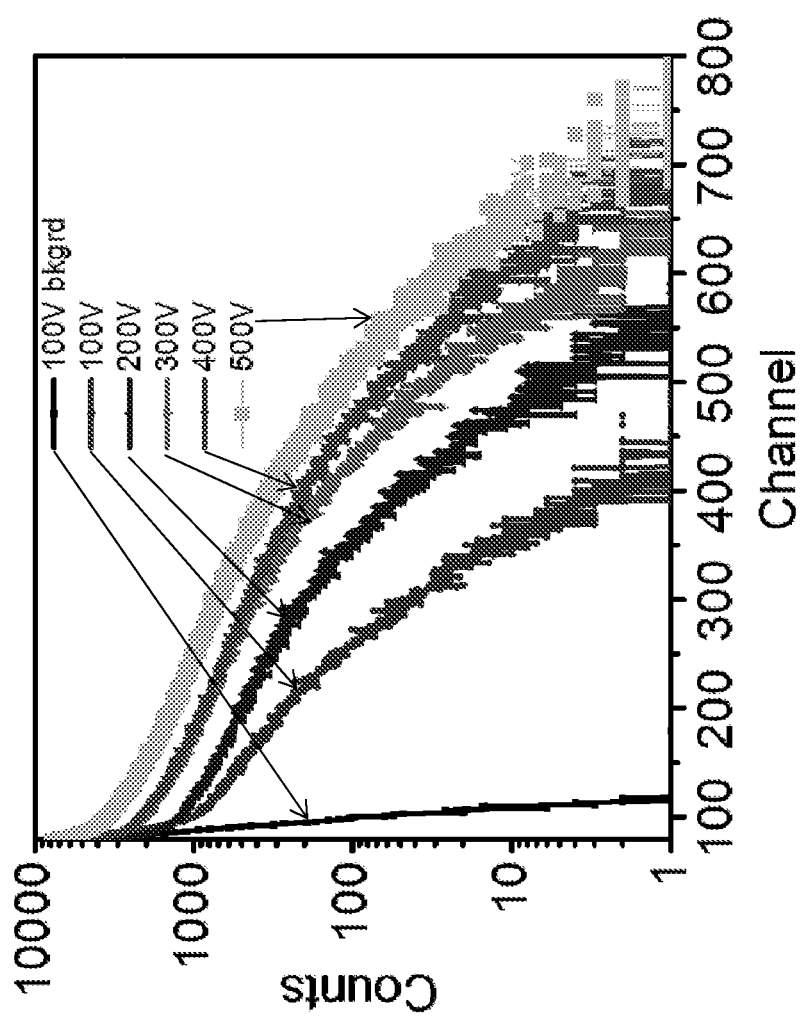
FIG. 11 shows 122 keV $^{57}$Co spectral responses obtained from the $Tl_6SeI_4$ detector (sample A, 1.0 mm thick) as a function of various bias voltages from 100 V to 500 V. Sample A was grown using raw material synthesized with adding fine carbon powder. The line labeled as 100 V bkgd refers to the background at 100 V.
Figure 12:
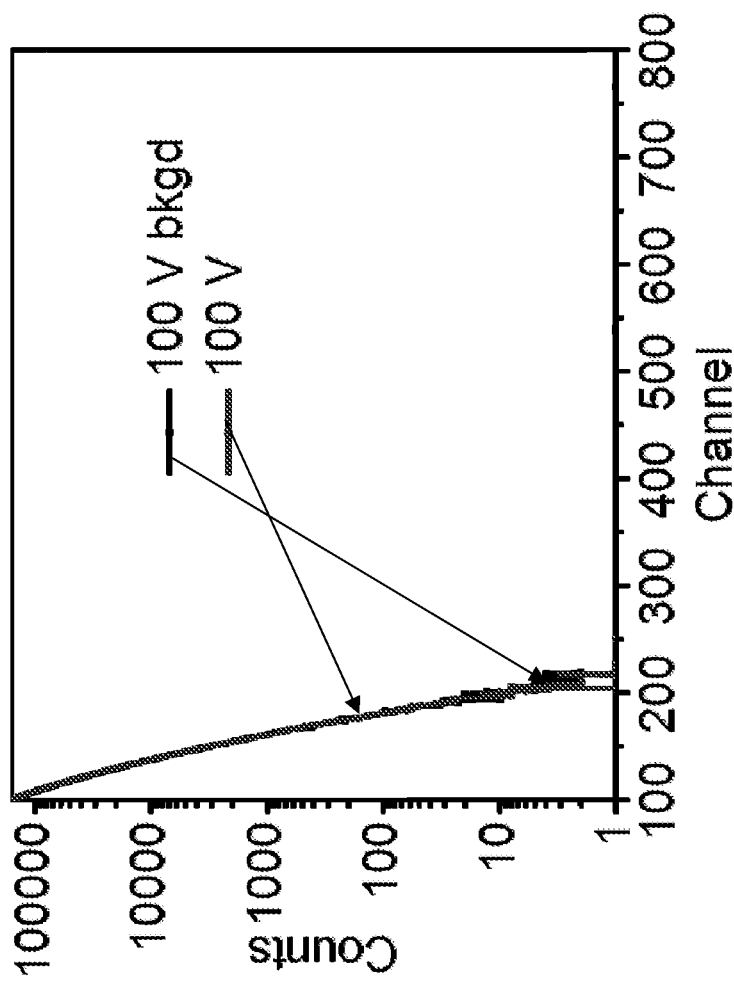
FIG. 12 shows 122 keV $^{57}$Co spectral responses obtained from the $Tl_6SeI_4$ detector (sample B, 1.0 mm thick) at a bias voltage of 100 V. Sample B was grown using raw material synthesized without adding fine carbon powder. The line labeled as 100 V bkgd refers to the background at 100 V.
Figure 13:
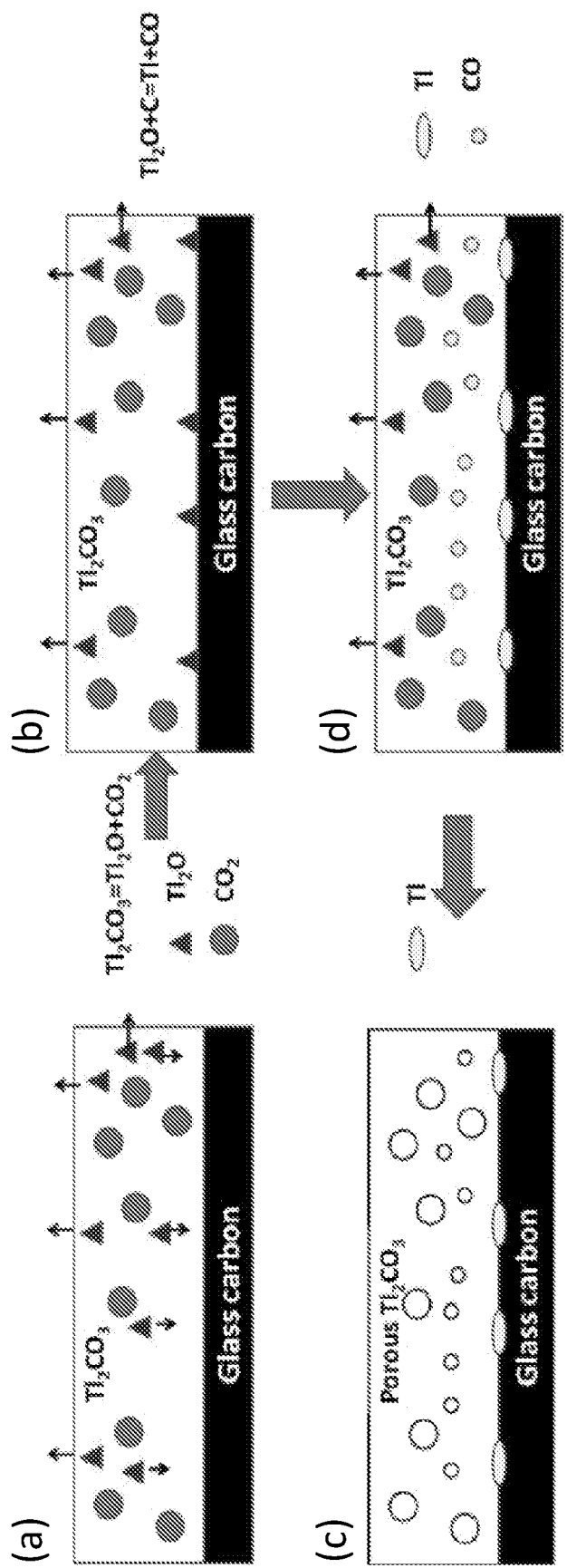
FIG. 13 shows the formation mechanism of porous $Tl_2CO_3$.

FIGS. 11 and 12 show the 122 keV γ-ray response from $^{57}Co$ at various applied voltages under cathode irradiation and anode irradiation configuration, respectively. The detector shows reasonable γ-ray response for the γ-ray energy at 122 keV, and a bump in the response curve could be distinguished over the background. The shoulder in spectra shifted toward a higher channel with increased applied bias voltage until saturation at 500 V. Sample B, which was grown without adding fine carbon powder, did not show any photoresponse upon 122 keV γ-ray from $^{57}Co$, as shown in FIG. 13. The great enhancement in detection performance suggests the effectiveness of adding carbon powder in order to remove/eliminate oxygen impurity.

Investigation of the Reactivity Between Carbon and Tl Oxidation.

Tl metal was found to be very sensitive to air and able to become oxidized easily in a few minutes. Therefore, it was necessary to analyze the chemical composition of the oxidation layer. PXRD measurement was used to determine the phase purity of the oxidation layer on the surface Tl metal. First, the Tl metal was intentionally exposed to air until the heavy oxidation layer formed. Subsequently, the black crust was scraped and collected using one blade. Secondly, the crust was ground into power for PXRD measurement. The experimental pattern matched well with the calculated pattern, indicating that the crust was of the $Tl_2O_3$ phase. No other phase was detectable in the experimental pattern.

One experiment was designed and performed to investigate the reactivity between $Tl_2O_3$ and carbon. One tube made of glassy carbon was first loaded with 1 g $Tl_2O_3$ fine powder (99.5% purity, Alfa Aesar). The tube was 6 cm in length. Second, this tube was loaded into one silica tube with a bigger size. Subsequently, the silica tube was sealed under vacuum. Finally, the silica tube was heated at 430° C. in a vertical tube furnace for 30 hours, and then naturally cooled down to room temperature.

An obvious residue pressure was observed when the silica tube was broken. After the tube was broken, one piece of black material was found in the bottom of the carbon tube. This material was stuck to the tip of the carbon tube by a yellow substance. Many tiny, metallic beads were distributed throughout the whole inner wall of the carbon tube. Some beads were large enough to be visible by naked eye. The quantity of beads was even more if observed under 30× optical microscope. Beads were evenly distributed over the inner wall several centimeters above the black material.

PXRD was adopted to determine the phases of the yellow and black substances. The PXRD pattern of the yellow substance agreed well with the calculated pattern of $Tl_2CO_3$, and no other phase was detectable. This indicated that the yellow substance was of the $Tl_2CO_3$ phase. On the other hand, the pattern of black chunks was of the pure $Tl_2O_3$ phase, based on a comparison of the PXRD pattern with the calculated pattern for $Tl_2O_3$.

Morphology observation on $Tl_2CO_3$ by SEM was performed in an attempt to better understand this substance. The $Tl_2CO_3$ was found to have a porous structure comprised of nano-sized single crystalline rods. Interestingly, some beads were found to exist in the area where $Tl_2CO_3$ was intentionally removed from glassy carbon.

SEM and EDS were exploited to observe the surface morphologies and analyze the composition of the beads, respectively. One fragment from the tail part of the carbon tube was extracted as a sample for an SEM-EDS test. Substances other than metallic beads were observed. These substances sticking to the inner wall of carbon tube appeared to possess high electrical conductivities, since they appeared greyer than the carbon substrate in the SEM images. Moreover, these substances had diverse morphologies including bead, tree, snowflake, and spindle. Interestingly, most of the bigger beads were surrounded by empty areas (carbon substrate).

Compositional analysis was carried out on these deposits of various morphologies. The EDS results indicated that the main compositional element for each type of deposit were Tl, with an atomic ratio higher than 90%. However, EDS mapping indicated the presence of C and O as well. The O signal was concentrated on the beads and was weak in comparison to that of the Tl signal, while the C signal was strongest (due to the glassy carbon substrate) except near the beads where the Tl signal dominates. Thus, it was concluded that the beads were Tl deposits covered by a $Tl_2O_3$ film due to surface air oxidation.

Now that the composition of the beads was understood, their presence well above the $Tl_2O_3$ starting point needed to be explained, especially given the macroscopic amounts deposited. Considering that the experiment was performed under nominally isothermal conditions and that Tl has a very low vapor pressure of $8 \times 10^{-9}$ atm at 400° C., it was difficult to explain the formation of Tl beads by vapor transport. It was more likely that Tl was transported by a relatively volatile species present in the system. One potential pathway for Tl transport would be the evaporation of $Tl_2O_3$ itself and its reaction with C at the carbon crucible surface. However, considering the low volatility and low partial pressure of $Tl_2O_3$ at 400° C. ($5.8 \times 10^{-12}$ atm), this pathway was not likely. TGA measurements were conducted in the temperature range of 25-400° C. and confirmed the thermal stability of $Tl_2O_3$, indicating that the transport was due to another mechanism.

Another possibility for Tl transport could be the decomposition of $Tl_2CO_3$ into $CO_2$ gas and the relatively volatile oxide $Tl_2O$. The vapor pressure of $Tl_2O$ is around $2 \times 10^{-6}$ atm at 400° C., three orders of magnitude larger than that of Tl, and six orders of magnitude larger than that of $Tl_2O_3$. Furthermore, $Tl_2CO_3$ decomposition starts in the range of 300-430° C., meaning that the $Tl_2CO_3$ is unstable at the annealing temperature. The Tl transport to the crucible wall can thus be explained by the following process. First, solid $Tl_2O_3$ reacts with the glassy carbon crucible at the bottom of the carbon tube to produce liquid $Tl_2CO_3$ (the melting point of $Tl_2CO_3$ is just 280° C.). The overheated $Tl_2CO_3$ liquid is not stable at 400° C., and decomposes into $Tl_2O$ and $CO_2$ gas. The $Tl_2O$ evaporates and condenses onto the crucible wall, carried throughout the ampoule by the pressure from the $CO_2$ gas. The deposited $Tl_2O$ is reduced by the carbon wall to form small metallic Tl beads and films, and yields CO gas. The process is described by the following reactions:

(1) $Tl_2O_3(S)+C(S) = Tl_2CO_3(l)$ (Reaction)
(2) $Tl_2CO_3(l) \leftrightarrows Tl_2O(S)+CO_2(g)$ (Decomposition)
(3) $Tl_2O(S) \leftrightarrows Tl_2O(g) \leftrightarrows Tl_2O(S)$ (Sublimation & Condensation)
(4) $Tl_2O(S)+C(S) = 2Tl(l)+CO(g)$ (Reduction)
(5) The overall reaction formula is $Tl_2O_3(S)+C(S) \leftrightarrows 2Tl(l)+CO_2(g)+CO(g)$ The existence of a $Tl_2O_3$ chunk indicated that most of $Tl_2O_3$ did not react with the carbon wall, suggesting that the reaction was subject to a rate-limiting step. For example, reaction (5) could be inhibited by the increasing the $CO_2/CO$ partial pressures and decreasing the surface area of the glassy carbon.

The $Tl_2CO_3$ formed at the bottom of the crucible had a porous structure. This morphology may be due to the presence of CO and $CO_2$ gas bubbles formed in the reaction (2) and (4) as illustrated in FIG. 13. Some of the CO and $CO_2$ gas formed in the molten $Tl_2CO_3$ and along the crucible wall may have stayed in the viscous $Tl_2CO_3$ flux and become frozen in upon cooling as bubbles.

Theoretical Calculation of O Related Defects.

To understand the effect of oxygen on the electronic properties of $Tl_6SeI_4$, first-principles electronic structure calculations of oxygen defects were carried out in the supercell approach. The formation energies of intrinsic and extrinsic defects depend on the crystal growth conditions, which dictate the possible values of chemical potentials of the constituents (Tl, Se, I). First-principles total energy calculations of thermodynamic stability were carried out to determine the possible range of chemical potentials of the constituents that would allow growth of pure and precipitate-free $Tl_6SeI_4$. The region where $Tl_6SeI_4$ can be stabilized is described by the following set of linear equations, which represent the equilibrium between the heat of formation ($\Delta H_F$) of $Tl_6SeI_4$ with $\Delta H_F$ of the competing phases and with the chemical potentials $\Delta \mu_\alpha$ of elemental components:

$$6\Delta\mu_{Tl}+\Delta\mu_{Se}+4\Delta\mu_I=\Delta H_F(Tl_6SeI_4)$$

$$\Delta\mu_\alpha \leq 0$$

$$n_{Tl}\Delta\mu_{Tl}+n_{Se}\Delta\mu_{Se}+n_I\Delta\mu_I \leq H_F \text{ (competing phases)}$$

The main competing phases in the Tl—Se—I system are: $Tl_2Se_2$, $Tl_5Se_3$, $TlI_3$, $TlI$, $TlSe$, and $Tl_5ISe_2$. The calculated region of thermodynamic stability of $Tl_6SeI_4$ is presented in FIG. 9 in the form of a stability phase diagram. The colored region in the diagram corresponds to the range of chemical potentials that allow the growth of $Tl_6SeI_4$ without precipitation of other competing phases. The stability region of $Tl_6SeI_4$ is wide but narrow, which suggests that precise control of stoichiometry is required to achieve precipitate-free growth of this compound. The two extreme points of this region, marked by circles, correspond to Tl-poor/Se-rich and Se-poor/Tl-rich growth conditions, correspondingly.

Figure 14:
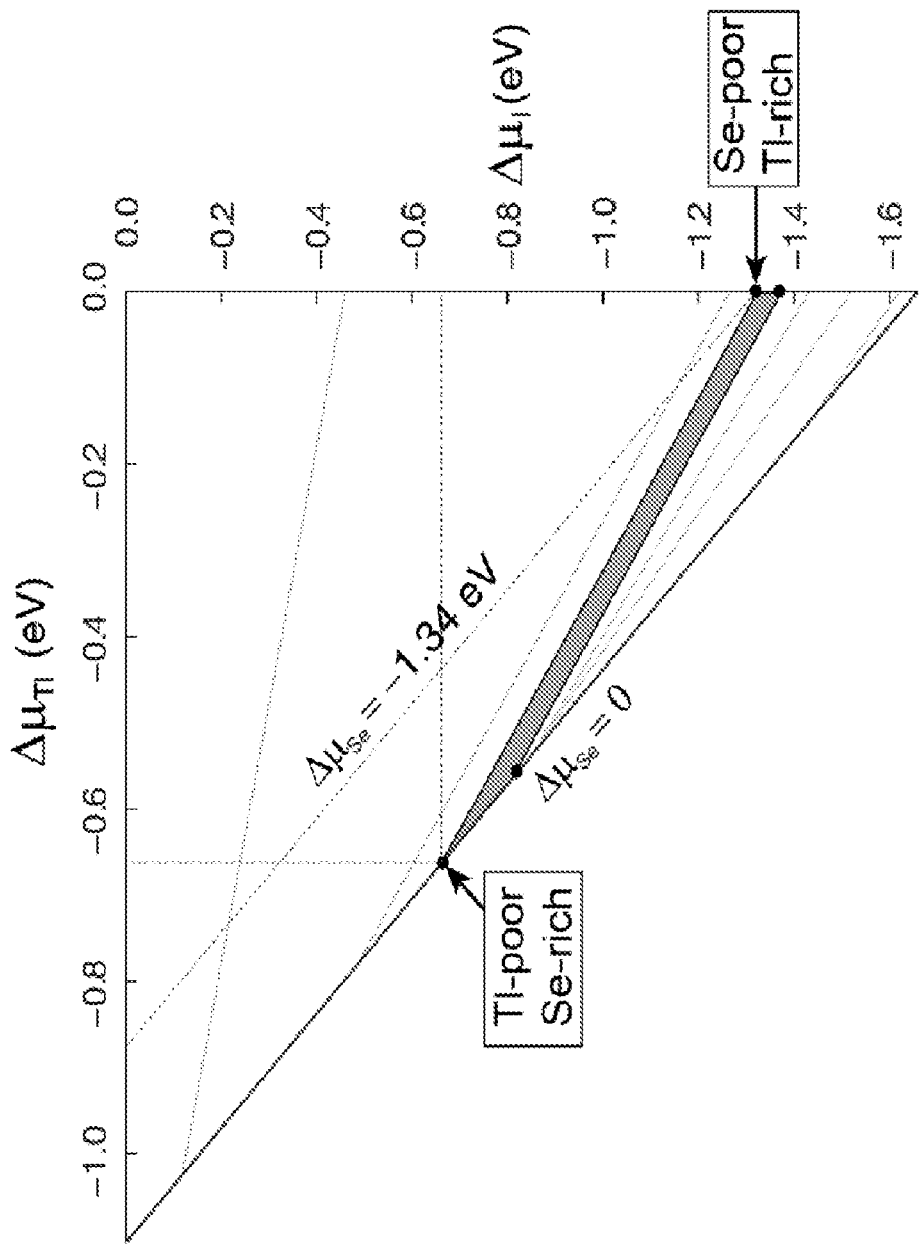
FIG. 14 depicts the thermodynamic stability of the $Tl_6SeI_4$ phase determined from the calculated ranges of chemical potentials under thermodynamic equilibrium with competing phases.

In the presence of oxygen, the additional competing oxide phases may form. Among these phases, Tl oxides $Tl_2O$ and $Tl_2O_3$ have the lowest calculated $\Delta H_F$. To avoid formation of these oxides, the chemical potential (concentration) of oxygen should be reduced substantially. The minimum chemical potential of oxygen at which precipitate formation will not occur depends strongly on growth conditions. Here, two extremal growth conditions were considered, as marked in FIG. 14. In Tl-poor/Se-rich growth condition $\mu_{Tl}=-0.67$ eV, $\mu_{Se}=0$, the competing Tl oxide is $Tl_2O_3$, and the maximum chemical potential of oxygen is $-0.72$ eV. In Se-poor/Tl-rich growth condition $\mu_{Tl}=0$, $-_{Se}=-1.34$ eV, the competing Tl oxide is $Tl_2O$, and the maximum chemical potential of oxygen is $-1.60$ eV. If the chemical potential (concentration) of oxygen is reduced below the threshold required for thermodynamic stability of Tl oxides, oxygen defects within the $Tl_6SeI_4$ phase will form, and the character of such defects will again depend on growth conditions. According to the results of the total energy calculations, the prevalent oxygen defects in Tl-poor/Se-rich growth condition will be O interstitials ($O_{int}$), followed by the O-for-Se substitution defects ($O_{Se}$), while in Se-poor/Tl-rich growth condition $O_{Se}$ defects will become dominant.

The effect of oxygen defects on the electronic properties of $Tl_6SeI_4$ was analyzed based on the comparison of the calculated electronic band structures for pure and defected supercells. The calculated electronic band structure of defect-free $Tl_6SeI_4$, plotted along the lines between the high-symmetry points in the Brillouin zone (BZ), is shown in FIG. 15A. The band structure of a supercell has a larger number of bands compared with that of a primitive unit cell due to band down-folding. The main features of the supercell band structure, such as character and width of the band gap and the character of the states near the band edges, however, remain unchanged. The calculated band structure shows that $Tl_6SeI_4$ is a direct band gap material with the PBE band gap of 1.43 eV (FIG. 15A). This calculated value is slightly underestimated compared with the measured value of 1.81 eV. Underestimation of band gaps is a known issue of DFT calculations employing exchange-correlation functionals based on the local density approximation, such as PBE. The band structure of $Tl_6SeI_4$ with an interstitial O atom ($O_{int}$) shows that the presence of oxygen leads to the formation of the deep electronic levels within the band gap (FIG. 15B). To demonstrate that this level is due to oxygen, the site-resolved and orbital-projected wave function character of each band was calculated (FIG. 15B). The deep levels were mostly comprised of O p states, while contribution of oxygen to most of the other bands was very small. These results confirm that $O_{int}$ impurities are detrimental to the electronic and detector properties of $Tl_6SeI_4$ because they can act as deep hole traps that could be responsible for nonradiative recombination of carriers due to carrier capture, and should be eliminated.

The band structure of $Tl_6SeI_4$ calculated with an O atom substituting an Se atom is shown in FIG. 15C. In contrast to the interstitial oxygen, $O_{Se}$ does not create any levels within the band gap and mostly contributes to the bands that are located 1 to 2 eV below the valence band. Since O and Se are electronic analogues belonging to the same group in the Periodic Table, O-for-Se substitution does not change the character of chemical bonding in this system. Therefore, the $O_{Se}$ defect is electrically inert and will not have any detrimental effect on the detector properties of $Tl_6SeI_4$.

The results of the first-principles calculations suggest that Se-poor/Tl-rich growth conditions promote the formation of electrically inactive $O_{Se}$ defects, rather than deep hole trapping $O_{int}$ defects. However, Se-poor growth conditions also promote the formation of Se vacancies which by themselves are deep trap level centers. Additionally, in Se-poor/Tl-rich growth conditions it is more difficult to avoid the formation of $Tl_2O$, because it will form at lower chemical potential of oxygen. In ideal growth conditions, the concentration of oxygen impurities should be equal to the concentration of Se vacancies. In this case, oxygen would occupy Se vacancy positions rather than interstitial ones, becoming electrically benign, and the detrimental effects of both oxygen and Se vacancies on the electronic properties of $Tl_6SeI_4$ would be eliminated. The initial reduction of the oxygen level below the level of Se vacancies is therefore a necessary step.

Adding carbon to the reaction, although beneficial for oxygen removal, can potentially lead to undesired consequences, such as possible incorporation of carbon atoms into the lattice of $Tl_6SeI_4$, resulting in defects that could act as deep level traps. In order to investigate such a possibility, the formation energies of the various C impurity defects were evaluated by means of first principles total energy calculations. The results of the calculations for neutral (uncharged) substitutional and interstitial C defects in the C-rich limit are summarized in Table 9.

TABLE 9

Calculated formation energies of carbon defects in $Tl_6SeI_4$

| Defect | $C_{Tl1}$ | $C_{Tl2}$ | $C_I$ | $C_{Se}$ | $C_{int}$ |
|---|---|---|---|---|---|
| Formation energy (eV) | 6.10 | 6.10 | 7.75 | 6.76 | 6.20 |

It can be seen from the Table 9 that the formation energies of all carbon defects are very high. They are significantly higher than the formation energies of oxygen defects (~1 eV), as well as the formation energies of most of the native defects in $Tl_6SeI_4$, which are in the 0.75-3 eV range. It is therefore extremely unlikely for any kind of carbon defect to appear in $Tl_6SeI_4$ as a result of adding of graphite powder to the reaction mix. Graphite addition is therefore deemed a safe and efficient way of eliminating oxygen contamination from $Tl_6SeI_4$.

The facile chemical reduction method described here should also be applicable in eliminating oxygen impurities in other Tl-based hard radiation detection materials such as Tl Br, $Tl_4HgI_6$, $Tl_3AsSe_3$, $TlGaSe_2$, $TlInSe_2$ $TlSn_2I_5$ and $Tl_6SI_4$.

Example 3

In this Example, the systematic material purification, impurity analysis, synthesis, crystal growth and detection performance of $Tl_6SI_4$ are described. The effectiveness of material purification by evaporation and zone refining methods was confirmed by impurity analysis using glow discharge mass spectrometry (GDMS). A large-sized single crystal was grown from melt by the Bridgman method, and then fabricated as a detector with a high resistivity on the order of $10^{12}$ Ω·cm. (See, Bridgman, P. W. Certain Physical Properties of Single Crystals of Tungsten, Antimony, Bismuth, Tellurium, Cadmium, Zinc, and Tin. *Proceedings of the American Academy of Arts and Sciences* 60, 305-383, doi:10.2307/25130058 (1925).) The detector detected Ag Kα X-rays (22.4 keV) and γ-rays from $^{57}$Co (122 keV). Spectroscopic resolution was achieved for α-particles from $^{241}$Am (5.5 MeV) with a full width at half maximum of 27% at an electric field of 2500 V·cm$^{-1}$. Drift mobility measurements via a time of flight technique using α-particles photoresponse revealed a high electron mobility of 35±7 cm$^2$·V$^{-1}$·s$^{-1}$.

Experimental Section

Material Purification Using Evaporation Method in a Bent Tube.

The precursors for synthesizing Tl$_6$SI$_4$ raw material were TlI (99.999% purity, Alfa Aesar), Tl (99.999% purity, Alfa Aesar) and S (99.999% purity, Alfa Aesar). The evaporation in a bent tube method, described in Example 1, was used for purifying volatile Tl and S. A silica ampoule is flame bent in the middle section, and one half of the ampoule is loaded with Tl or S to be purified. The ampoule is vertically mounted into a two-zone horizontal furnace. The left half ampoule loaded with material is located in the hot zone, while the other half is located in the cold zone. Owing to the temperature gradient between two zones, the volatile material will be transported and condense on the right half of ampoule. Table 10 shows the temperature settings for purification of S and TlI precursors in bent tubes. Since the saturated vapor pressure of Tl metal precursor is merely 110 Pa at 800° C., the purification by the evaporation method is not efficient for Tl metal. Therefore, multiple-pass zone refining was adopted to purify Tl$_2$S precursor instead of purifying Tl metal by the evaporation method. Tl$_2$S binary precursor was synthesized by the direct reaction of purified S by evaporation and Tl (99.999% purity, Alfa Aesar) with a molar ratio of 2:1 at 500° C. for 24 h in a rocking furnace. A glassy carbon boat with an inner diameter (ID) of 10 mm and an outer diameter (OD) of 14 mm was selected as container for loading purified S and TlI precursors. Subsequently, the glassy carbon crucible was sealed into a fused silica tube with an ID of 15 mm and OD of 19 mm. The synthesis was performed at 550° C. in a tube furnace for 24 h. Subsequently, the as-synthesized Tl$_2$S was loaded into a glassy carbon boat (width: 16 mm, length: 10 cm, height: 10 mm) for further purification by zone refining. The loaded boat was then put into a fused silica tube with an ID of 21 mm and OD of 25 mm. The above processes were performed in the N$_2$ filled glovebox to avoid the oxidation of Tl$_2$S. Finally, the tube was sealed using flame under a residual pressure of 2×10$^{-4}$ mbar. The purification of Tl$_2$S ingot was performed in a horizontal 2-zone refining furnace, each zone having a width of 5 cm and the distance between zones being ~10 cm. The temperature was set as 550° C. for each zone to ensure the complete melting of Tl$_2$S while maintaining a reasonably narrow molten width of the Tl$_2$S ingot. In order to achieve higher effectiveness of purification, the travelling speed of the stage was set as low as 1 cm·h$^{-1}$. Based on the temperature profile, the temperature gradient was estimated to be 46° C.·cm$^{-1}$. The Tl$_2$S ingot was subjected to 50-pass purification by zone refining. The purified Tl$_2$S ingot was obtained in the inert glovebox after breaking the tube to avoid oxidation. The seed (tip) part of purified Tl$_2$S ingot was typically shiny, and came with a smooth surface. However, the tail section of Tl$_2$S ingot came with a coarse surface, which can be regarded as the signature of purification effectiveness. Since most of the impurities are supposed to accumulate in the tail section of ingot due to impurity segregation, only the tip section of the ingot with one-third of the tube length was extracted for impurity analysis by GDMS and further synthesis of Tl$_6$SI$_4$ raw material.

TABLE 10

The temperatures set for hot and cold zones in two-zone furnace and melting and boiling points of S and TlI precursors.

| Precursor | Nominal purity from producer | Temperature for hot zone (° C.) | Temperature for cold zone (° C.) | Temperature gradient estimated (° C.·cm$^{-1}$) | Melting point (° C.) | Boiling point (° C.) |
|---|---|---|---|---|---|---|
| S | 99.999%, Alfa Aesar | 450 | 200 | 10 | 115 | 444 |
| TlI | 99.999% | 850 | 550 | 15 | 442 | 823 |

Impurity Analysis.

Impurity analysis was performed on S, TlI and Tl$_2$S and precursors before and after purification by using GDMS. Positive Ar$^+$ ions were accelerated onto the sample to generate erosion and atomization of the surface of sample. The sputtered species from the sample surface were ionized by Ar plasma, and then extracted into a mass spectrometer where they were identified and measured. The sample was crushed into small pieces and embedded into high-purity indium metal to get a high conductivity for glow discharge. The accuracy of GDMS measurements was in the range of 1 part per million (ppm) to 0.1 part per billion (ppb) depending on the host material and the specific impurity.

Synthesis, Crystal Growth, Processing and Characterization.

The synthesis of Tl$_6$SI$_4$ polycrystalline raw material was performed by the direct reaction of a combination of purified TlI and Tl$_2$S precursors with a molar ratio of 4:1 in an evacuated silica ampoule at 550° C. for 24 h in a rocking furnace, followed by slow cooling to room temperature for 24 h. The purified TlI precursor was preheated at 80° C. for 12 h to remove surface moisture before synthesis. The heating temperature of 500° C. for synthesis would ensure complete melting of Tl$_6$SI$_4$. Subsequently, the polycrystalline raw material was put into a conical-tipped and carbon-coated quartz ampoule with a thickness of 1.5 mm and an inner diameter of 10 mm, which was sealed at a vacuum pressure of 2×10$^{-4}$ mbar. A single crystalline ingot of Tl$_6$SI$_4$ was grown from stoichiometric melt using the vertical two-zone Bridgman method. (See, Bridgman, P. W. Certain Physical Properties of Single Crystals of Tungsten, Antimony, Bismuth, Tellurium, Cadmium, Zinc, and Tin. *Proceedings of the American Academy of Arts and Sciences* 60, 305-383, doi:10.2307/25130058 (1925).) At the beginning of the growth process, the ampoule was held in the hot zone (550° C.) of a two-zone Bridgman furnace for 12 h to achieve complete melting of polycrystalline raw material. The ampoule was subsequently translated from the hot zone to cold zone at a speed of 0.5 mm·h$^{-1}$. The temperature of the cold zone was set at 200° C. to generate a temperature gradient of 23° C.·cm$^{-1}$. After crystal growth, the ingot was annealed in-situ at 200° C. for 24 h in the Bridgman furnace without translation. Finally, the ingot was cooled down to room temperature within 24 h to avoid cracks due to thermal stress. The $Tl_6SI_4$ boule was cut perpendicular to the growth direction using a diamond saw. A wafer was extracted from the middle section of the boule and subsequently polished with silicon carbide sand paper and alumina slurries with a particle size of 0.05-1 μm. After fine polishing with slurries, no further surface etching and passivation were conducted on the polished surface. In order to analyze the phase purity of as-grown crystal, a powder X-ray diffraction (PXRD) pattern of ground specimen from crystals was collected using a Si-calibrated CPS 120 INEL diffractometer operating at 40 kV and 20 mA (Cu Kα radiation λ=1.5418 Å). The powder XRD pattern was recorded using the Windif data acquisition program. Solid-state diffuse reflectance UV-vis-near IR diffuse reflectance spectroscopy was performed with a Shimadzu UV-3600PC double-beam, double-monochromator spectrophotometer operating in the 200-2500 nm region using $BaSO_4$ as the 100% reflectance reference. The photoluminescence (PL) of $Tl_6SI_4$ compound was carried out at 17.5 K. The sample was cooled down using a closed-cycle He cryostat (SHI cryogenics DE-202). The excitation source was a 405-nm, continuous-wave (CW) semiconductor laser (Coherent, Inc.) with a beam diameter of ~0.8 mm and intensity controlled by a computer. The laser beam was passed through a 405-nm bandpass filter (FHWM of 10 nm, Thorlabs, Inc.) prior to hitting the sample surface. Subsequently, a 650-nm low pass filter was used to filter the scattered and reflected laser light before the entrance slit to the monochromator. The PL spectrum was analyzed with a ¾-m SPEX grating monochromator (both entrance and exit slit widths were set at 200 μm) and the signal was detected with a R928 Hamamatsu photomultiplier tube. An optical chopper (frequency: 710 Hz) and a lock-in amplifier with phase-sensitive detection were used to improve the signal-to-noise ratio. Finally, the PL spectra were recorded at a rate of 0.5 nm/s.

Mechanical Property Assessment.

The Vickers hardness tests were performed on a Struers Duramin 5 automated micro hardness test instrument. The Vickers hardness test method comprises indenting the test material with a diamond indenter in the form of a right pyramid with a square base and an angle of 136 degrees between opposite faces, subjected to a load of 0.01 kgf. The full load is applied on the surface of a fine polished wafer for 5 s. The two diagonals of the indentation left in the surface of the material after removal of the load are measured using a built-in microscope, and their average is calculated. Therefore, the area of the sloping surface of the indentation is estimated. As shown in the equation below, the Vickers hardness is the quotient obtained by dividing the kgf load by the square mm area of indentation.

$$HV = \frac{2F\sin\frac{136°}{2}}{d^2}$$

where F is the load in kgf, and d is the arithmetic mean of the two diagonals, d1 and d2 in mm.

Device Fabrication.

The wafer with a dimension of 4×5 mm$^2$ and a thickness of 0.8 mm was rinsed using acetone before the planar-type detector device was fabricated. One-square-inch glass was used as the substrate for mounting the wafer. Electrodes of 1.5 mm in diameter were formed on the top and bottom surfaces of the wafer by applying fast-dry carbon paint. Subsequently, Cu wires of 0.1 mm were bonded to the electrodes and Cu foil strips were attached to the glass substrate.

Charge Transport and X-Ray Photocurrent Measurement.

The direct current (DC) current-voltage (I-V) measurements under dark were performed. DC conductivity was measured using a Keithley 6517B electrometer and a Keithley 6105 resistivity adapter. Electromagnetic interference and photoconductive responses were eliminated by a metallic enclosure. In order to estimate the photosensitivity upon X-rays, photocurrent measurements were performed using 22.4 keV Ag X-rays as an irradiation source. Ag X-rays were generated from a CPS 120 INEL diffractometer operating at an accelerating voltage of 40 kV and a current of 2 mA.

Hard Radiation Spectroscopy Measurements.

Spectrometric characteristics of the $Tl_6SI_4$ detector were measured using a homemade system including an eV-550 preamplifier box, a spectroscopy amplifier (ORTEC, Model 572A), and a computer-installed multichannel pulse height analyzer (Model ASPEC-927). The final signals were read into the MAESTRO-32 software. 122 keV γ-ray spectroscopy measurements were carried out in atmosphere, and the distance between $^{57}$Co radiation source with an activity of 0.2 mCi and detector was set at ~5 cm. The optimal linear amplifier gain, amplifier shaping time and recorded time were 500, 0.5 μs and 180 s, respectively, for γ-ray spectral response tests. An uncollimated $^{241}$Am alpha source with an activity of 1.0 μCi was used to characterize the detector radiation response upon 5.5 MeV α-particles. The measurements were carried out also in the atmosphere with a source-detector distance of ~2 mm. The linear amplifier gain, amplifier shaping time. and recording time were 50, 2.0 μs and 180 s, respectively. All of the measurements were performed under the cathode irradiation (electron-collection) configuration. Pulse height spectra without a radiation source were also collected as background noise under the same experimental conditions. For drift mobility measurements, the complete transient waveforms from the preamplifier were collected using a homemade interface based on National Instruments software with a maximum time resolution of 4 ns. The rise time of the transient waveform corresponds to a transient time between 10% and 90% of the amplitude of the transient pulse.

Results and Discussion

Impurity Analysis.

Table 11 shows the comparison of impurity concentrations in TlI before and after purification by the evaporation in a bent tube method. The evaporation method was found to be very effective for removing Na, Cl, Fe, Sn and Eu. However, this method was not effective for removing K and Br. Since TlBr and TlI have similar chemical and physical properties, the elimination of Br impurity appears to be difficult. However, group-VII halogen impurity Br should introduce empty impurity levels resonant with the conduction band when taking the sites of I, since Br is isovalent to I. Therefore, the Br impurity should not significantly affect the charge transport. As shown in Table 12, the evaporation method was also found to be highly effective in eliminating most of the impurities in S including Na, B, Mg, Al, Cl, K, Ca, Fe and Bi. However, this method was not effective in eliminating Se, which is another kind of chalcogenide element. Considering that Se is isovalent to S, this impurity should not introduce impurity level when occupying S sites in the lattice. Thus, the influence of Se impurity on charge transport was not significant. Table 13 shows the comparison of impurity analysis for $Tl_2S$ before and after purification by 50-pass horizontal zone refining. The multi-pass zone refining shows high effectiveness in removing Mg, Ni, Cu, Ag, Te, Hg, Pb and Bi. However, no purification effectiveness on Al impurity was found.

TABLE 11

Comparison of impurity concentrations (ppm, wt) in TlI starting material before and after purification by evaporation in a bent tube.

| Impurities | Before purification | After purification |
| --- | --- | --- |
| Na | 1.5 | 1 |
| Cl | 1.9 | 0.63 |
| K | 2.4 | 2.7 |
| Fe | 0.02 | <0.01 |
| Br | 76 | 48 |
| Sn | 0.26 | <0.1 |
| Eu | 6.70 | <0.1 |

TABLE 12

Comparison of impurity concentrations (ppm, wt) of S before and after purification by evaporation in a bent tube.

| Impurities | Before purification | After purification |
| --- | --- | --- |
| Na | 0.50 | <0.05 |
| B | 0.18 | <0.01 |
| Mg | 0.09 | <0.01 |
| Al | 0.09 | <0.01 |
| Cl | 2.00 | <0.1 |
| K | 0.63 | <0.1 |
| Ca | 3.50 | <0.1 |
| Fe | 0.45 | <0.01 |
| Se | 0.50 | 0.27 |
| Bi | 0.20 | <0.01 |

TABLE 13

Comparison of impurity concentrations (ppm, wt) of $Tl_2S$ before and after purification by 50-pass horizontal zone refining.

| Impurities | Before purification | After purification |
| --- | --- | --- |
| Mg | 0.15 | <0.01 |
| Al | 1.11 | 0.9 |
| Ni | 0.02 | <0.01 |
| Cu | 4.82 | <0.01 |
| Ag | 6.76 | <0.05 |
| Te | 17.61 | <0.5 |
| Hg | 12.05 | <0.5 |
| Pb | 19.46 | 3 |
| Bi | 6.49 | 1 |

Figure 16:
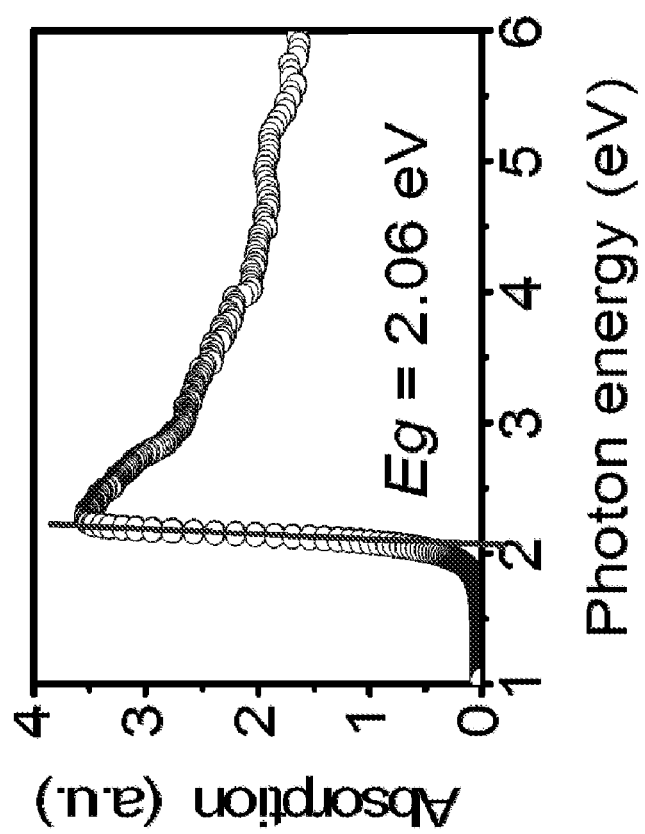
FIG. 16 depicts the UV-vis-near IR optical absorption spectrum of $Tl_6SI_4$.

Crystal Growth and Characterization $Tl_6SI_4$ raw material was synthesized by a stoichiometric direct combination reaction of the purified TlI and $Tl_2S$ precursors, and then used for crystal growth using a vertical two-zone Bridgman furnace. The as-grown crystal was phase-pure, as evidenced by its PXRD pattern on a powdered specimen from the pristine crystal. FIG. 16 shows the optical absorption spectrum of $Tl_6SI_4$, indicating a sharp bandgap at 2.06 eV, in accordance with the dark-red color of the wafer extracted from the boule. This bandgap was sufficiently broad to suppress the formation of thermally activated carriers at room temperature, yet remained narrow enough to produce many photo-induced electron-hole pairs, due to a lower pair creation energy. In addition, this material was very robust in mechanical properties, as shown from its Vickers hardness measurement. Its Vickers hardness was estimated to be around 63 kg·mm$^2$.

Optical Properties

Figures 17A, 17B:
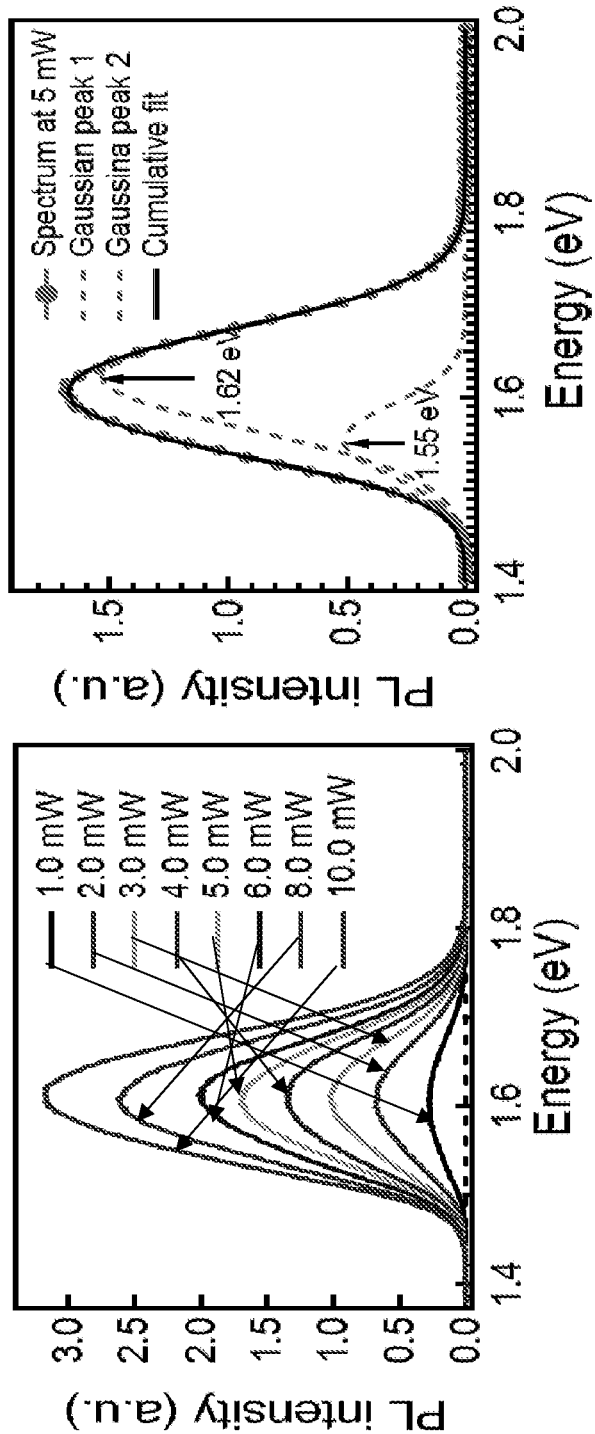
FIG. 17A shows PL spectra from a $Tl_6SI_4$ single crystal collected using laser power of 1-10 mW at 17.5 K.
FIG. 17B depicts a representative spectrum collected at 5 mW of laser power where dotted lines indicate Gaussian peaks used to fit (solid line) the spectrum (line with solid circle).

To aid in the identification of the underlying recombination mechanisms and evaluate crystal quality, FIG. 17A shows the PL spectra for a $Tl_6SI_4$ single crystal under various laser powers at 17.5 K. The emission intensity was found to increase with increasing laser power. FIG. 17B shows a representative PL spectrum collected using a laser power of 5 mW. The PL spectrum showed a broad emission centered around 1.6 eV, consistent with a previously reported result on this compound, while showing a much narrower full width at half maximum (FWHM) (a FWHM value of ~0.15 eV compared to previous value of ~0.18 eV). The narrower PL band indicates improved crystal quality. Each PL spectrum was resolved using two overlapping Gaussian peaks with peak positions at 1.55 and 1.62 eV, respectively. Considering that the bandgap of $Tl_6SI_4$ was 2.06 eV at room temperature, both these peaks were attributed to recombination involving defects.

The integrated PL intensity (1) is related to the excitation power (L) by a power law of the form, $I \propto L^k$, where k is a dimensionless exponent indicating the nature of the observed transition. The values of the exponent k are generally in one of the following ranges: $0<k<1$ or $1<k<2$, where the former is attributed to donor-acceptor pair recombination (DAP) or free-to-bound recombination (such as free-hole and neutral-donor recombination or free-electron and neutral-acceptor recombination), and the latter is for the free- or bound-exciton emission. The values of k calculated from the power dependence of the two PL spectra are (0.95±0.15) and (1.09±0.05) for the 1.55 and 1.62 eV bands, respectively. While the 1.62-eV band is clearly due to free- or bound-exciton emissions, the k value of ~1 for the 1.55 eV emission band makes it inconclusive as to the type of emission responsible for this band.

Charge Transport and Detection Performance

Figure 18B:
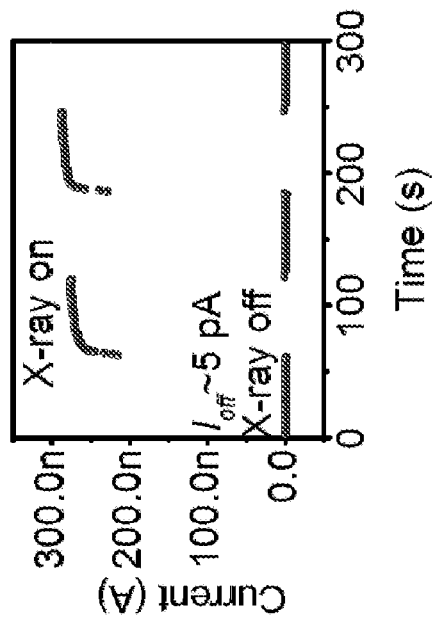
FIG. 18B depicts the photocurrent response to Ag X-rays by switching the X-ray source on and off at a bias of 100 V.
Figure 18D:
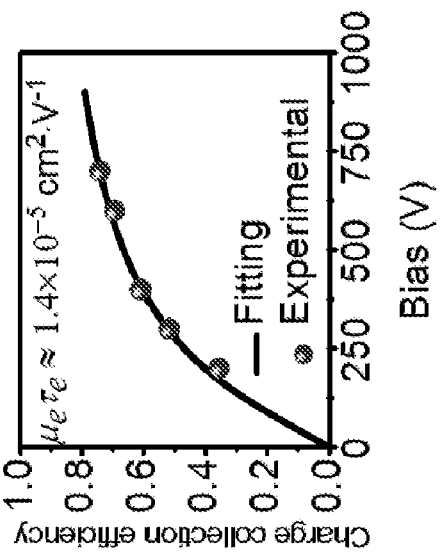
FIG. 18D shows the $\mu_e\tau_e$ estimation based on 122 keV γ-ray spectroscopy measurements using the Hecht equation.
Figure 18A:
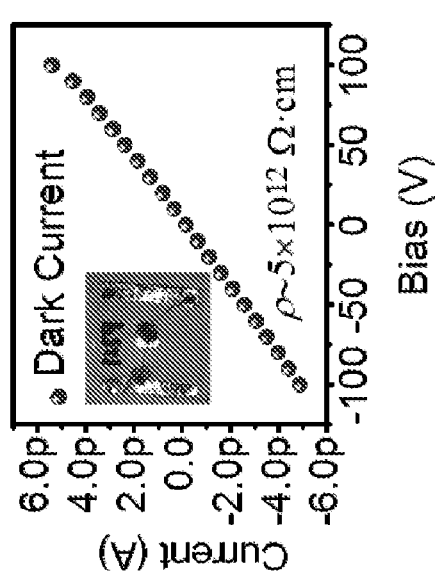
FIG. 18A depicts the I-V characteristics of a detector made from a $Tl_6SI_4$ wafer with a thickness of 0.8 mm. The inset is the planar-type detector device with carbon paint electrodes.

A planar-type detector was made of a 0.8 mm thick $Tl_6SI_4$ wafer with carbon paint electrodes of 1.5 mm in diameter. The wafer was cut perpendicular to the crystal growth direction; therefore, the applied electric field direction was parallel to the crystal growth direction. There was no sign of reactivity between the carbon electrode with the crystal on the interface of the electrodes. The dark current of the detector was measured to assess the leakage current that can cause noise in detection signals. As shown in FIG. 18A, the current-voltage (I-V) curve of the detector was very linear in the range from −100 V to +100 V, suggesting the absence of space charge effects and ionic conductivity, which are detrimental to detection performance. The resistivity of the detector was estimated as $5 \times 10^{12}$ Ω·cm, which guarantees a low background noise for detection. This high resistivity in the order of $10^{12}$ Ω·cm can be easily obtained, regardless of growth conditions. FIG. 18B demonstrates the photocurrent of the detector at a bias of 100 V for 22.4 keV X-rays from an Ag Kα source by switching the X-rays on and off. The photocurrent under X-ray irradiation was at least 6 orders of magnitude higher than the dark current, demonstrating the high photosensitivity of the Tl$_6$SI$_4$ detector to X-rays.

Figure 18C:
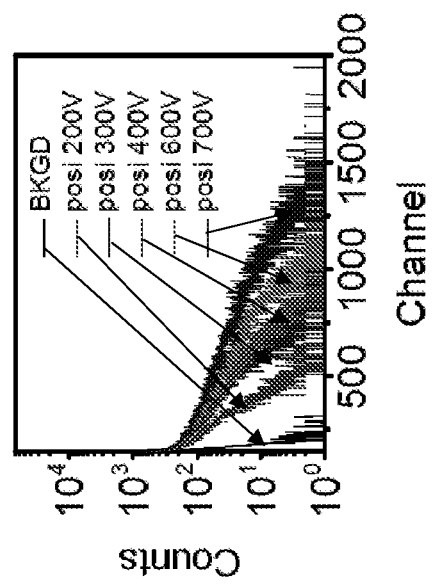
FIG. 18C shows the 122 keV γ-ray spectral response of $^{57}$Co at various applied voltages. The curve "BKGD" refers to the noise of energy spectrum at 700 V.

Materials for γ-ray detection are sought because of their extensive potential applications, but lack of widespread use as compared to the more common X-ray detectors. However, it is more difficult to obtain γ-ray photoresponse because of the very low flux of photons, which poses stricter requirements on the quality and impurity grade of the detectors. FIG. 18C demonstrates the spectral photoresponse of a Tl$_6$SI$_4$ detector against 122 keV γ-rays from $^{57}$Co under cathode irradiation (electron-collection) configuration. The detector showed obvious photoresponse under γ-ray irradiation that could be clearly distinguished from the background noise, demonstrating that material purification leads to substantially higher crystal quality, and subsequently a γ-ray photoresponse can be obtained. Importantly, the shoulder accompanying the spectral tail shifted to higher energy channels with increasing applied bias, demonstrating that the signal arises from the γ-ray source and not artificial effects induced by the high bias voltages. Although the γ-ray photoresponse was very reasonable, the detector was not able to resolve the characteristic peaks of the 122 keV γ-ray from $^{57}$Co. The absence of energy spectral resolution can be attributed to carrier trapping centers leading to low charge collection efficiency.

The single-carrier Hecht equation was used to estimate the mobility-lifetime product for electrons, based on γ-ray spectroscopy measurements. (See, Hecht, K. Zum Mechanismus des lichtelektrischen Primarstromes in isolierenden Kristallen. *Zeitschrift für Physik* 77, 235-245, doi: 10.1007/bf01338917 (1932).) The single-carrier Hecht equation can be expressed as:

$$CCE(V) = \frac{Q}{Q_0} = \frac{\mu\tau V}{L^2}\left(1 - e^{-\frac{L^2}{\mu\tau V}}\right)$$

where CCE(V) is the charge collection efficiency under the applied V, Q is the measured photopeak/shoulder channel number at bias V, L (0.08 cm) is the thickness of the detector, and $Q_0$ refers to the theoretical saturated channel number of the photopeak/shoulder. The mobility-lifetime product for electrons ($\mu_e\tau_e$) and Q can be derived from the experimental data of CCE(V) and Q Since there is no spectral resolution in the spectra, the maximum channel positions instead of peak channel numbers were used to fit the single-carrier Hecht equation. As demonstrated in FIG. 18D, the mobility-lifetime of $\mu_e\tau_e$ was derived as ~1.4×10$^{-5}$ cm$^2$·V$^{-1}$ by fitting the data of charge collection efficiency (CCE) versus applied bias.

Figures 19A, 19B, 19C:
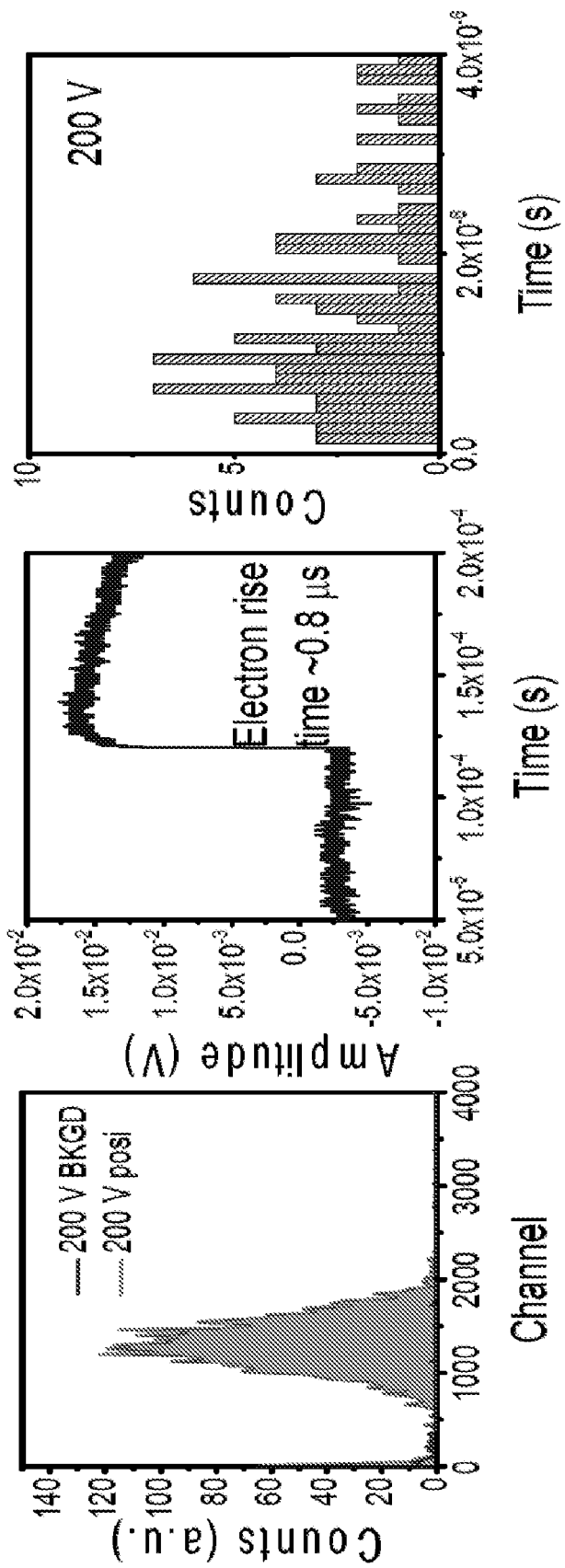
FIG. 19A depicts the $^{241}$Am α-particles spectral response of $Tl_6SI_4$ detector at a bias of 200 V under cathode irradiation configuration.
FIG. 19B shows a typical transient pulse from one radiation event recorded by the preamplifier.
FIG. 19C depicts the histogram of electron rise time distribution at 200 V bias for a $Tl_6SI_4$ detector induced by α-particles.

The detection performance against 5.5 MeV α-particles from an un-collimated $^{241}$Am beam with an activity of 1 μCi was further measured. As shown in FIG. 19A, the spectral photoresponse was recorded by irradiating the cathode of detector at a bias of 200V. The signal with a broad photopeak against α-particles could be distinguished from the background noise, indicating the presence of energy resolution with a full width at half maximum of 27% at 200 V. The carrier mobility is one important figure of merit for detection materials. The electron mobility ($\mu_e$) of the detector was estimated by measuring the drifting time ($t_{drift}$) of electrons from an interaction close to the cathode as the electrons drift the entire thickness of the detector. The $\mu_e$ can be estimated by the following equation:

$$\mu_e = \frac{D}{Et_{drift}}$$

where D and E are the detector thickness and the applied electric field, respectively. The electron drift time $t_{drift}$ is measured by determining the rise time of the transient waveform from the preamplifier. FIG. 19C illustrates one typical transient pulse with an electron rise time of 0.8 μs induced by α-particles from $^{241}$Am. One hundred measurements of electron rise time were performed and averaged in order to enhance the reliability of the data. As shown in FIG. 19C, an average value of electron rise time of ~0.90 s was calculated at an applied electric field of 2500 V·cm$^{-1}$. Since the attenuation of α-particle (<20 μm) is much smaller than the detector thickness (0.08 cm), the electron drift time essentially equals the electron rising time. Using the equation above, the electron mobility of Tl$_6$SI$_4$ detector can be estimated to be 35±7 cm$^2$·V$^{-1}$·s$^{-1}$.

Example 4

In this example, one purification method without phase segregation by vertical narrow zone refining is illustrated. The purification effectiveness was assessed by impurity analysis before and after purification. In addition, compositional analysis was performed to investigate the stoichiometry of the purified raw material. The charge transport properties and detection performance upon exposure to 122 keV γ-rays were assessed.

Experimental Section

Synthesis of Ternary Raw Material.

The Tl$_6$SI$_4$ compound was synthesized by the direct reaction of Tl (5N purity, Alfa Aesar), S (5N purity, Alfa Aesar) and TlI (5N purity, Alfa Aesar) with the appropriate stoichiometry. These precursors were put into a carbon-coated and tapered silica ampoule with an OD of 18 mm and an ID of 15 mm, and then sealed under a vacuum pressure of <1×10$^{-4}$ mbar. The synthesis was performed at 550° C. for 24 hours in a tube furnace. After complete reaction, the tube was cooled down naturally to room temperature in 24 hours. The synthesized boule had a length of 12 cm.

Purification of Raw Material by Horizontal Zone Refining.

After synthesis, the ingot was purified by horizontal zone refining using 50 passes. The horizontal zone refining furnace had 3 zones and a temperature gradient of 41° C./cm when the controlling temperature was set at 500° C. The heater moved through the ingot with a travelling speed of 2 cm/h, and then moved back to the starting point with a translation speed of 2 cm/s. In this way, one cycle of purification was finished. Phase determination on samples extracted from the seed, middle and tail sections was performed to examine the possible phase segregation after 50-pass zone refining.

Purification of Raw Material by Vertical Zone Refining.

After synthesis, another ingot was purified by vertical zone refining using 50 passes. The vertical ZR furnace had a single zone and a temperature gradient of 47° C./cm when the controlling temperature was set to 500° C. The heater moved upward with a travelling speed of 2 cm/h and stopped when it was 3 cm below the top of the ingot. In this way, one cycle of purification was finished. After 50 cycles, the purification by vertical zone refining was done. Phase determination by powder X-ray diffraction measurement was performed to examine the possible phase segregation. Compositional analysis by a scanning electron microscopy equipped with energy-dispersive X-ray spectroscopy was conducted to analyze the possible off-stoichiometry of the purified raw material.

Impurity Analysis.

Impurity analysis was performed to check the effectiveness of purification by vertical zone refining. The purified samples were extracted from the middle section of the boule, and then analyzed by Glowing Discharge Mass Spectrometry (GDMS).

Crystal Growth and Annealing.

The tail section of ingot purified by vertical zone refining was discarded, as most of impurities had accumulated in the tail section after zone refining. The middle and tip sections of ingot were extracted for crystal growth. The purified raw material was put into a tapered and carbon coated silica tube with one ID of 11 mm and 13 mm, and the tube was sealed under a $1 \times 10^{-4}$ mbar vacuum. The raw material was premelted in a vertical two-zone Bridgman furnace prior to crystal growth. The Bridgman furnace was equipped with a motor-controlled platform. Crystal growth proceeded with a translation rate of 0.5 mm/h in a temperature gradient of 30° C./cm. The temperature of the hot zone was set at 520° C. to ensure complete melting of the compound, while the cold zone was set as 200° C. to allow for in situ annealing to improve crystallinity and reduce thermal stress. The in-situ annealing lasted for 7 days.

Phase Determination.

In order to check whether severe phase segregation had occurred after purification, powder X-ray diffraction (PXRD) of patterns of ground samples was conducted using a CPS 120 INEL diffractometer.

Compositional Analysis.

The stoichiometry of the $Tl_6SI_4$ raw material after purification was analyzed using a Hitachi SU-8030 scanning electron microscope (SEM) equipped with a backscattered electron (BSE) detector operating with an accelerating voltage of 20 kV.

Charge Transport Characterization.

The DC conductivity was measured using a Keithley 6517B electrometer and a Keithley 6105 resistivity adapter with stainless steel electrodes. Electromagnetic interference and photoconductive responses were eliminated by the metallic enclosure. The electrodes were made by applying fast-dry Ag or carbon paint purchased from TED Pella. The diameter of the cathode on the top of the sample was around 2 mm, while the area of the anode on the bottom of the sample was the same as that of the sample bottom face. One mil Cu wires were attached to the contacts made by Ag or carbon paint, and then attached to Cu foils. The sample was mounted on a 1-square-inch glass substrate. The thickness of the device was 1.0 mm Gamma Rays Performance Characterization.

Detector performance was probed using a 0.3 mCi $^{57}Co$ source generating 122 keV γ rays. The fabricated device was connected to an eV-550 preamplifier box. 400 V bias voltage was applied. The signals were transferred to an ORTEC amplifier (Model 572 Å) with a gain of 200, shaping time of 2.0 is, and collection time of 280 s before they were evaluated by a dual 16 K input multichannel analyzer (Model ASPEC-927) and read into the MAESTRO-32 software.

Results and Discussions

Purification of Raw Material by Horizontal Zone Refining.

The $Tl_6SI_4$ raw material was subjected to 50-pass horizontal zone refining. The tail section of purified ingot was found to be yellow, indicating severe phase segregation occurred after zone refining. The phases of two samples extracted separately from the tail and seed sections of ingot were determined by PXRD measurement. The phase of sample extracted from the tail section could be indexed to a pure Tl phase, while the phase of sample from the seed section could be indexed to a pure $Tl_2S$ phase. The existence of $Tl_2S$ and TlI phases clearly suggested that severe phase segregation occurred during the purification process using horizontal zone refining.

Figure 20:
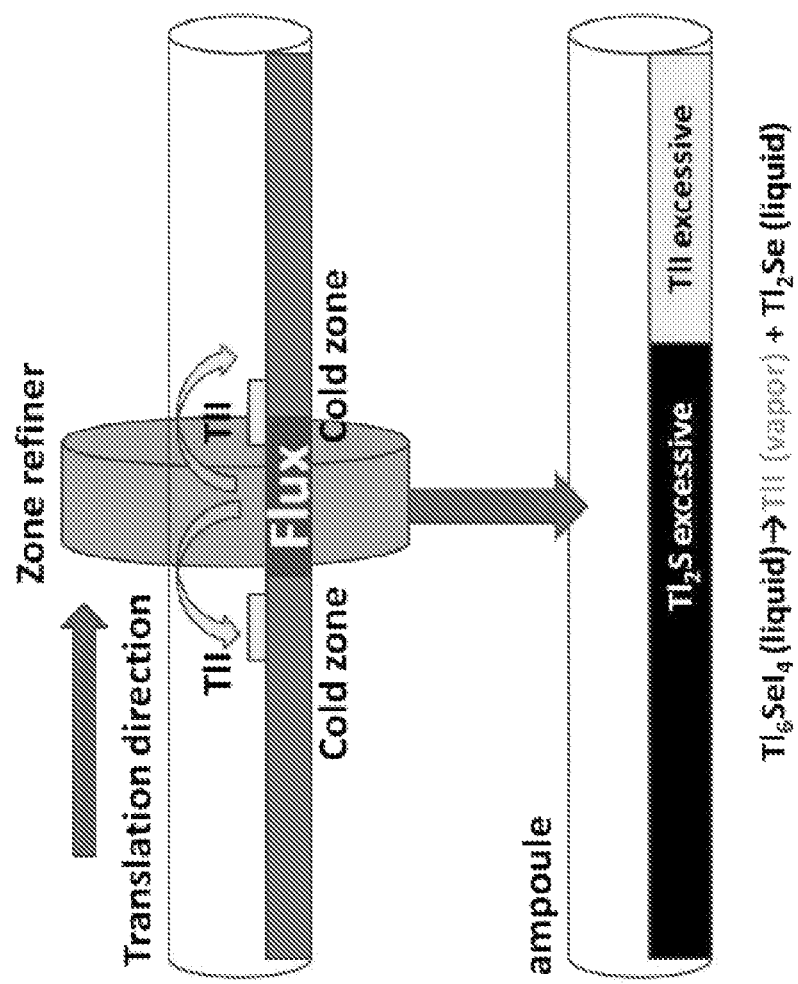
FIG. 20 depicts the generation of non-stoichiometry during horizontal zone refining of $Tl_6SI_4$.

Due to non-uniform temperature distribution of the zone refiner and the large open vapor space, the molten zone lost volatile TlI component (FIG. 20). The non-volatile $Tl_2S$ remained in the molten zone, while volatile TlI component was transported by virtue of the temperature gradient between the zone refiner and the colder sides. After multiple passes, the $Tl_6SI_4$ completely decomposed into TlI and $Tl_2S$. Therefore, TlI was left on the tail section, while $Tl_2S$ was left on the seed section. Based on the above results, horizontal zone refining of $Tl_6SI_4$ raw material was challenging for maintaining stoichiometry.

Purification of Raw Material by Vertical Zone Refining.

Figure 21:
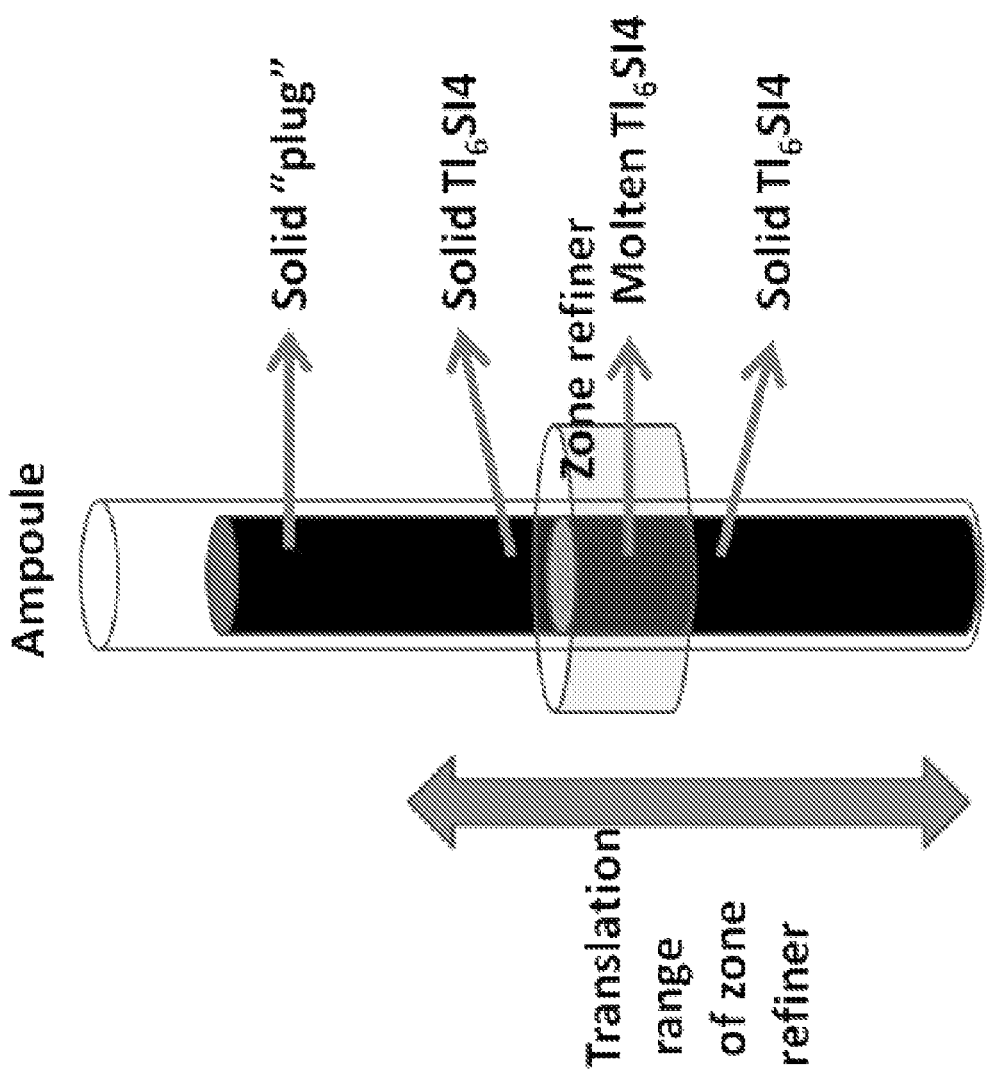
FIG. 21 shows vertical zone-melting purification of $Tl_6SI_4$.

Using a vertical configuration for zone melting, the decomposition of the ternary compound and the transport of the volatile component TlI could be largely suppressed, as shown in FIG. 21. In vertical zone melting the charge is first melted and solidified in the bottom of a vacuum-sealed ampoule. This ensures a stoichiometric compact solid without a gap between the material and the ampoule wall at the start. A narrow section of the solid was melted with a strip heater at the bottom of the ampoule and moved across the boule by moving the heater. As long as the top of the boule was solid, no decomposition of the molten ternary occurred because the melting was not connected to the vapor space. Small loss of TlI could occur by the sublimation of the solid at the top end of the boule, but this was a very slow process compared to evaporation. Once the heater and the molten zone reached the top of the boule, evaporation started and some TlI loss occurred. However, stopping the heater before it reached the top of the boule would prevent the loss of TlI. Therefore, the heater only moved upward to a certain position slightly below the top of the boule.

Vertical zone melting purification therefore was expected to maintain the stoichiometry of the ternary compound during purification. The sacrificial zone collecting the impurities could become somewhat TlI deficient, but this section of the boule was discarded during cropping.

PXRD measurements on samples extracted from the tip, middle, and tail sections of the purified boule were performed to examine the possible off-stoichiometry after purification. All the patterns could be indexed to pure phase $Tl_6SI_4$, indicating the absence of phase segregation. Further compositional analysis was performed on one cleaved piece from the middle section by SEM-EDS. No second phase was observed in the SEM image. In addition, the EDS result suggested the atomic ratio agreed well with the stoichiometry of $Tl_6SI_4$, indicating the stoichiometry was maintained after purification by vertical zone refining.

Assessment on Effectiveness of Purification by Vertical Zone Refining.

A sample from the middle section of the purified boule was selected for purity analysis by GDMS. Table 14 shows the comparison of impurity concentrations before and after purification. The GDMS purity analysis in Table 14 shows that vertical zone refining was effective in removing Na, Si, V, Fe, Cu, Rb, Sn, Pb and Bi from $Tl_6SI_4$. No purification effect was found for Se and Te.

TABLE 14

Comparison of impurity concentrations before and after purification by 50-pass vertical zone refining.
(↑: increase ↓: decrease →: no change)

| Impurities | Impurity concentration before purification (ppm, wt) | Impurity concentration after purification (ppm, wt) | Trend |
|---|---|---|---|
| Li | 0.02 | <0.01 | ↓ |
| Na | 1.8 | 0.38 | ↓ |
| Si | 0.28 | 0.06 | ↓ |
| P | 0.09 | <0.01 | ↓ |
| K | 2 | 1.5 | → |
| V | 0.26 | <0.01 | ↓ |
| Cr | 0.02 | <0.01 | ↓ |
| Fe | 0.05 | <0.01 | ↓ |
| Cu | 0.45 | <0.01 | ↓ |
| Ge | 0.03 | <0.01 | ↓ |
| Br | 36 | 50 | → |
| Se | 2.2 | 1.7 | → |
| Rb | 0.06 | <0.01 | ↓ |
| Ag | 0.06 | <0.05 | ↓ |
| Sn | 0.6 | <0.1 | ↓ |
| Te | 0.9 | 0.8 | → |
| Re | 0.05 | <0.01 | ↓ |
| Pb | 2.1 | 0.92 | ↓ |
| Bi | 1.2 | 0.20 | ↓ |

Charge Transport Properties and Detection Performance.

Figure 22:
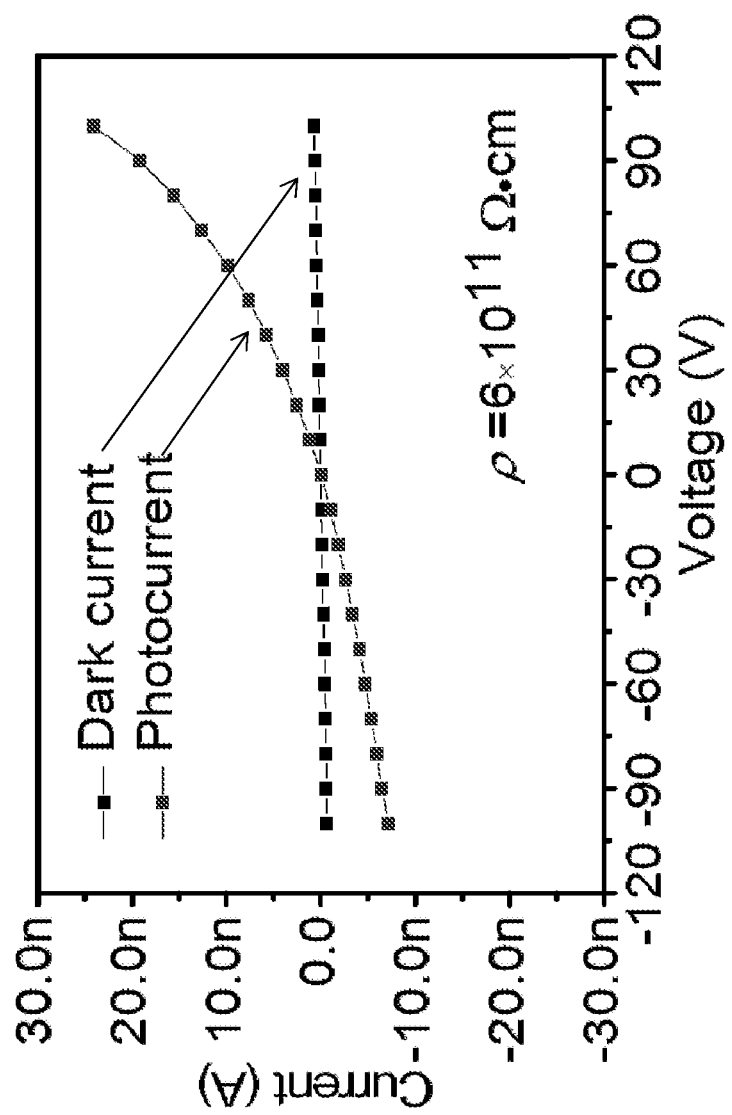
FIG. 22 depicts the I-V characteristics of a $Tl_6SI_4$ detector device with carbon paint contacts mounted on 1-in$^2$ glass substrates upon dark and regular lab light.

The current-voltage (I-V) measurements for $Tl_6SI_4$ sample are shown in FIG. 22. The sample was under bias for 200 seconds prior to recording the dark leakage current through the device at each bias. The leakage current was recorded as the applied bias increased from −100 V to 100 V in 10 V increments. The sample showed liner I-V characteristic in the voltage range from −100 V to 100 V. The resistivity of the sample was around $6 \times 10^{11}$ Ω·cm. This sample showed obvious photocurrent upon exposure to low-flux regular lab fluorescent light filtered by a blue optical filter, since the photocurrent was two orders of magnitude higher than the dark current.

Figure 23:
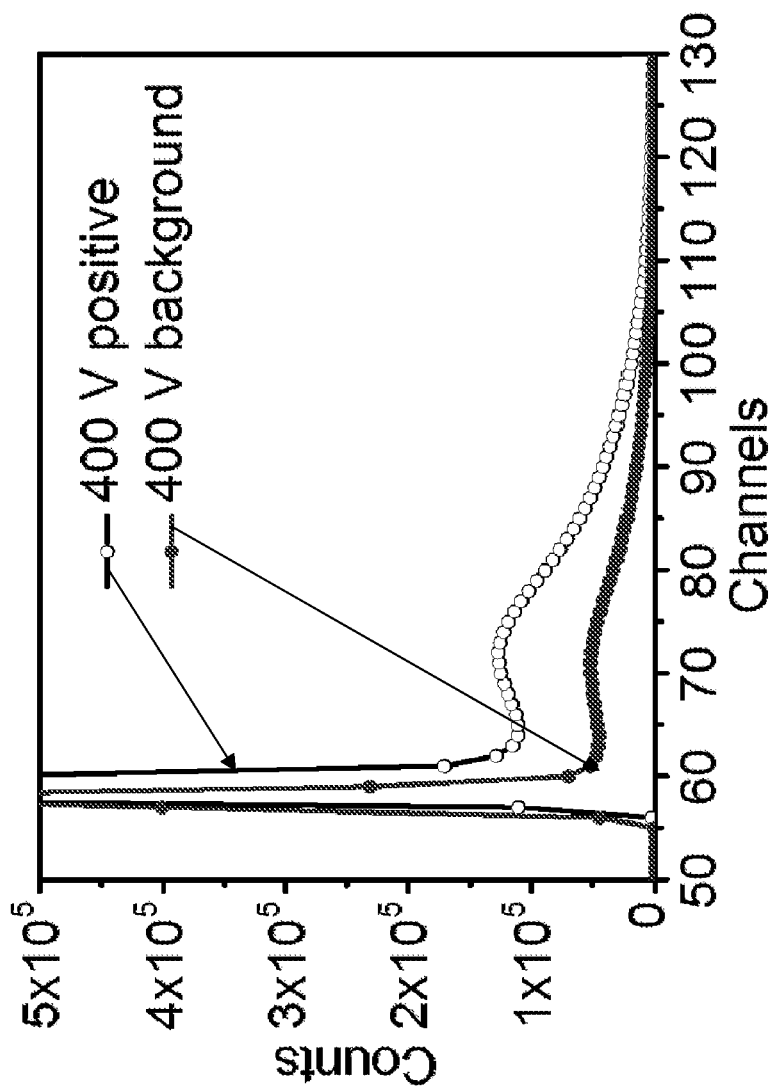
FIG. 23 shows 122 keV $^{57}$Co spectral responses obtained from the $Tl_6SI_4$ detector at 400 V bias voltage. The line labeled as 400V bkgd refers to the signal background at 400 V.

FIG. 23 shows a 122 keV γ-ray response from $^{57}$Co at 400 V applied voltages (cathode irradiation). The detector showed reasonable γ-ray response for the γ-ray energy at 122 keV, and a bump in the response in the response curve could be distinguished over the background.

CONCLUSION

In this example, one purification method without phase segregation for crystal growth of $Tl_6SI_4$ hard radiation detection material by vertical zone refining was reported. Both phase determination and compositional analysis indicated that the stoichiometry was maintained after multi-pass vertical zone refining. Impurity analysis revealed that this purification method was highly effective. The crystal grown with the purified raw material showed very little leakage current and reasonable photo-response upon exposure to γ-rays from $^{57}$Co.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for purifying an inorganic material, the method comprising:
   loading a starting inorganic material comprising one or more impurity elements into a tube having a first end, a second end, and a body connecting the first end and the second end, wherein the body of the tube forms a bend between the first end of the tube and the second end of the tube;
   evacuating the tube to reduce a pressure in the tube;
   sealing the evacuated tube to form a sealed, evacuated tube that is sealed at the first end and the second end;
   mounting the sealed, evacuated tube in a furnace having a first temperature zone and a second temperature zone, wherein the sealed, evacuated tube is mounted with its first end in the first temperature zone, its second end in the second temperature zone, and its bend directed upward, such that the bend is elevated above the first end of the tube, the second end of the tube and the first and second ends of the tube are directed downward, and a top of the bend is at a highest part of the tube;
   increasing the temperature in the first temperature zone to a temperature that is sufficiently high to melt and volatilize the starting inorganic material in the first end of the tube, while maintaining the temperature in the second temperature zone at a temperature lower than the temperature in the first temperature zone, wherein the volatilized inorganic material condenses on a wall of the body of the tube in the second temperature zone and flows down to the second end of the tube under the force of gravity; and
   solidifying the condensed inorganic material that collects in the second end of the tube to provide a purified inorganic material having a lower impurity concentration than the inorganic starting material.

2. The method of claim 1, wherein the concentration of one or more of the impurity elements in the purified inorganic material is at least a factor of 10 less than the concentration of those impurity elements in the starting inorganic material.

3. The method of claim 1, wherein the impurity concentration in the purified inorganic material is no greater than 1 ppm, atomic basis.

4. The method of claim 1, wherein the starting inorganic material is a thallium compound.

5. The method of claim 4, wherein the thallium compound is TlI, $Tl_2Se$, $Tl_2S$, or a combination of two or more thereof.

6. The method of claim 1, wherein the starting inorganic material is elemental S, Se, or Cd.

7. The method of claim 1, wherein the inorganic material is a thallium chalcohalide.

8. The method of claim 7, wherein the one or more impurity elements include Al, Pb, Bi, Si, or a combination of two or more thereof.

9. The method of claim 1, wherein the mounted, sealed, evacuated tube forms an inverted v-shape extending from the first end to the second end, and the bend is the apex of the inverted v-shape.

10. The method of claim 1, wherein sealing the opening of the evacuated tube comprises flame sealing the opening of the evacuated tube.

11. The method of claim 9, wherein sealing the opening of the evacuated tube comprises flame sealing the opening of the evacuated tube.

12. The method of claim 11, wherein the ampoule is a silica ampoule.

13. The method of claim 1, wherein the tube consists of the first end, the second end, and the body connecting the first end and the second end.

14. A method of forming a purified thallium chalcohalide, the method comprising:
   loading a thallium chalcohalide precursor material comprising one or more impurity elements into a tube having a first end, a second end, and a body connecting the first end and the second end, wherein the body of the tube forms a bend between the first end of the tube and the second end of the tube;
   evacuating the tube to reduce a pressure in the tube;
   sealing the evacuated tube to form a sealed, evacuated tube that is sealed at the first end and the second end;
   mounting the sealed, evacuated tube in a furnace having a first temperature zone and a second temperature zone, wherein the sealed, evacuated tube is mounted with its first end in the first temperature zone, its second end in the second temperature zone, and its bend directed upward, such that the bend is elevated above the first end of the tube, the second end of the tube and the first and second ends of the tube are directed downward, and a top of the bend is at a highest part of the tube;
   increasing the temperature in the first temperature zone to a temperature that is sufficiently high to melt and volatilize the thallium chalcohalide precursor material in the first end of the tube, while maintaining the temperature in the second temperature zone at a temperature lower than the temperature in the first temperature zone, wherein the volatilized thallium chalcohalide precursor material condenses on a wall of the body of the tube in the second temperature zone and flows down to the second end of the tube under the force of gravity;
   solidifying the condensed thallium chalcohalide precursor material that collects in the second end of the tube to provide a purified thallium chalcohalide precursor material having a lower impurity concentration than the thallium chalcohalide precursor starting material; and
   reacting the purified thallium chalcohalide precursor material with one or more additional thallium chalcohalide precursor materials to form the purified thallium chalcohalide.

15. The method of claim 14, wherein one of more impurities whose concentration is lower in the purified thallium chalcohalide precursor material than in the thallium chalcohalide precursor starting material are impurities that introduce deep electronic levels in the bandgap of the purified thallium chalcohalide.

16. The method of claim 15, wherein the purified thallium chalcohalide is $Tl_6SI_4$ or $Tl_6SeI_4$.

17. The method of claim 16, wherein the one or more impurities comprise Al, Pb, Bi, Si, or a combination of two or more thereof.

* * * * *